(12) United States Patent
Lee et al.

(10) Patent No.: US 10,566,396 B2
(45) Date of Patent: Feb. 18, 2020

(54) ORGANIC LIGHT-EMITTING DISPLAY APPARATUS AND METHOD OF MANUFACTURING THE SAME

(71) Applicant: Samsung Display Co., Ltd., Yongin-si (KR)

(72) Inventors: Duckjung Lee, Yongin-si (KR); Arong Kim, Yongin-si (KR); Jungsun Park, Yongin-si (KR); Hyunsung Bang, Yongin-si (KR); Jiyoung Choung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 116 days.

(21) Appl. No.: 15/611,818

(22) Filed: Jun. 2, 2017

(65) Prior Publication Data
US 2017/0352712 A1 Dec. 7, 2017

(30) Foreign Application Priority Data
Jun. 3, 2016 (KR) .......................... 10-2016-0069388

(51) Int. Cl.
*H01L 27/32* (2006.01)
*H01L 51/00* (2006.01)
(Continued)

(52) U.S. Cl.
CPC ...... *H01L 27/3246* (2013.01); *H01L 27/3211* (2013.01); *H01L 51/0016* (2013.01);
(Continued)

(58) Field of Classification Search
CPC .................................................. H01L 27/3211
See application file for complete search history.

(56) References Cited

U.S. PATENT DOCUMENTS 9,054,341 B2 6/2015 Kim et al.
2008/0296600 A1* 12/2008 Kwack ................ H01L 51/5265
257/98
(Continued)

FOREIGN PATENT DOCUMENTS

KR 10-2002-0029553 4/2002
KR 10-2014-0082089 7/2014
(Continued)

*Primary Examiner* — Eugene Lee
(74) *Attorney, Agent, or Firm* — H.C. Park & Associates, PLC

(57) ABSTRACT

An organic light-emitting display apparatus including a substrate; a pixel electrode on the substrate; a pixel-defining layer including an opening exposing at least a portion of the pixel electrode; an intermediate layer including a center area on the pixel electrode and a side area extending from the center area and arranged on the pixel-defining layer, the intermediate layer including one or more common layers and an emission layer; a protective layer covering top surfaces of the center area and the side area of the intermediate layer and exposing at least a portion of the pixel-defining layer; and an opposite electrode spaced apart from the intermediate layer by the protective layer and arranged on the protective layer and portions of the pixel-defining layer, the portions being exposed by the protective layer.

19 Claims, 15 Drawing Sheets

(51) Int. Cl.
*H01L 51/52* (2006.01)
*H01L 51/56* (2006.01)

(52) U.S. Cl.
CPC ...... *H01L 51/5209* (2013.01); *H01L 51/5215* (2013.01); *H01L 51/5218* (2013.01); *H01L 51/5221* (2013.01); *H01L 51/5234* (2013.01); *H01L 51/5253* (2013.01); *H01L 51/56* (2013.01); *H01L 2227/323* (2013.01); *H01L 2251/301* (2013.01); *H01L 2251/558* (2013.01)

(56) References Cited

U.S. PATENT DOCUMENTS

| | | | |
|---|---|---|---|
| 2010/0253607 A1* | 10/2010 | Shiozaki | H01L 27/3244 345/76 |
| 2011/0204388 A1* | 8/2011 | Jeong | H01L 51/5281 257/88 |
| 2013/0175533 A1* | 7/2013 | Lee | H01L 27/124 257/59 |
| 2014/0145156 A1* | 5/2014 | Choi | H01L 27/32 257/40 |
| 2015/0001490 A1* | 1/2015 | Lee | H01L 27/3262 257/40 |
| 2015/0044801 A1 | 2/2015 | Lee et al. | |
| 2015/0048336 A1 | 2/2015 | Tanaka | |
| 2015/0179718 A1 | 6/2015 | Kim et al. | |
| 2016/0233285 A1* | 8/2016 | Lee | H01L 51/5228 |
| 2017/0229519 A1* | 8/2017 | Suzuki | G02B 5/20 |

FOREIGN PATENT DOCUMENTS

| KR | 10-2014-0146070 | 12/2014 |
|---|---|---|
| KR | 10-2015-0072863 | 6/2015 |

* cited by examiner

ORGANIC LIGHT-EMITTING DISPLAY APPARATUS AND METHOD OF MANUFACTURING THE SAME

CROSS-REFERENCE TO RELATED APPLICATION

This application claims priority from and the benefit of Korean Patent Application No. 10-2016-0069388, filed on Jun. 3, 2016, which is hereby incorporated by reference for all purposes as if fully set forth herein.

BACKGROUND

Field

Exemplary embodiments relate to an organic light-emitting display apparatus and a method of manufacturing the organic light-emitting display apparatus.

Discussion of the Background

An organic light-emitting display apparatus is a self-emissive display apparatus having an organic light-emitting device including a hole injection electrode and an electron injection electrode, and an emission layer arranged therebetween, in which a hole injected from the hole injection electrode and an electron injected from the electron injection electrode are combined in the emission layer to thereby generate an exciton which emits light when the exciton transitions from an excited state to a ground state.

In order to deposit the emission layer over a substrate, a fine metal mask (FMM) technique has generally been used. However, due to its disadvantages such as increased manufacturing costs, there is a demand for an alternative deposition technique.

The above information disclosed in this Background section is only for enhancement of understanding of the background of the inventive concepts, and, therefore, it may contain information that does not form the prior art that is already known in this country to a person of ordinary skill in the art.

SUMMARY

Recently, a technique of forming, through a photo patterning process, an intermediate layer of an organic light-emitting device, the intermediate layer including an emission layer, has been studied.

When the organic light-emitting device is manufactured through the photo patterning process, a thickness of a protective layer covering the intermediate layer decreases in a side area of a pixel, and a stripper penetrates between the protective layer and the intermediate layer, so that the intermediate layer including the emission layer is damaged.

In order to solve many problems including the aforementioned problem, exemplary embodiments provide an organic light-emitting display apparatus and a method of manufacturing the organic light-emitting display apparatus in which the occurrence of a defective pixel is decreased by preventing damage to an intermediate layer including an emission layer.

Additional aspects will be set forth in the detailed description which follows, and, in part, will be apparent from the disclosure, or may be learned by practice of the inventive concepts.

According to exemplary embodiments, an organic light-emitting display apparatus includes a substrate; a pixel electrode on the substrate; a pixel-defining layer including an opening exposing at least a portion of the pixel electrode; an intermediate layer including a center area on the pixel electrode and a side area extending from the center area and arranged on the pixel-defining layer, the intermediate layer including one or more common layers and an emission layer; a protective layer covering top surfaces of the center area and the side area of the intermediate layer and exposing at least a portion of the pixel-defining layer; and an opposite electrode spaced apart from the intermediate layer by the protective layer and arranged on the protective layer and portions of the pixel-defining layer, the portions being exposed by the protective layer.

A minimum value of a distance between the intermediate layer and the opposite electrode that are spaced part from each other may be between about 50 Å and about 1000 Å.

The protective layer may include an area that directly contacts the pixel-defining layer.

Thicknesses of the one or more common layers and the emission layer included in the side area of the intermediate layer may decrease in a direction away from the center area throughout the side area.

A difference between a thickness of the emission layer at the center area and a minimum thickness of the emission layer may be greater than a difference between a thickness of a portion of the protective layer, the portion covering the center area of the intermediate layer, and a minimum thickness of another portion of the protective layer, the other portion covering the side area of the intermediate layer.

The pixel electrode may be a reflective electrode, and the opposite electrode may be a transflective electrode or a transmissive electrode.

The protective layer and the opposite electrode may include the same conductive material.

The conductive material may include Al, Mg, Li, Ca, Cu, LiF/Ca, LiF/Al, MgAg, CaAg, or a compound thereof.

The pixel electrode may be a transflective electrode or a transmissive electrode, and the opposite electrode may be a reflective electrode.

The protective layer and the opposite electrode may include the same conductive material.

The conductive material may include Ag, Al, Mg, Li, Ca, Cu, LiF/Ca, LiF/Al, MgAg, CaAg, or a compound thereof.

The pixel electrode may include a first pixel electrode, a second pixel electrode, and a third pixel electrode that are spaced apart from each other on the substrate, and the intermediate layer may include a first intermediate layer arranged on the first pixel electrode and emitting light with a first color; a second intermediate layer arranged on the second pixel electrode and emitting with a second color; and a third intermediate layer arranged on the third pixel electrode and emitting with a third color, wherein the first intermediate layer, the second intermediate layer, and the third intermediate layer are spaced apart from each other.

The protective layer may include a first protective layer covering the first intermediate layer; a second protective layer covering the second intermediate layer; and a third protective layer covering the third intermediate layer, wherein the first protective layer, the second protective layer, and the third protective layer are spaced apart from each other.

According to one or more exemplary embodiments, a method of manufacturing an organic light-emitting display apparatus includes forming a pixel electrode on a substrate; forming a pixel-defining layer including an opening exposing at least a portion of the pixel electrode; forming, on the pixel electrode and the pixel-defining layer, an intermediate layer including one or more common layers and an emission layer; forming, on the intermediate layer, a protective layer exposing at least a portion of the pixel-defining layer; and forming, on the protective layer and the pixel-defining layer exposed by the protective layer, an opposite electrode that is spaced apart from the intermediate layer by the protective layer.

In the forming of the protective layer, the protective layer may be formed so that a minimum value of a distance between the intermediate layer and the opposite electrode that are spaced part from each other may be between about 50 Å and about 1000 Å.

The forming of the intermediate layer and the forming of the protective layer may include forming a lift off layer on the pixel-defining layer; forming a photoresist layer on the lift off layer; patterning the photoresist layer; exposing portions of the pixel electrode and the pixel-defining layer by etching the lift off layer by using the photoresist layer as an etching mask; forming the intermediate layer by depositing a material of the intermediate layer on the portions of the pixel electrode and the pixel-defining layer that are exposed by the lift off layer; forming, on the intermediate layer, the protective layer by depositing a material of the protective layer by using the lift off layer and the photoresist layer as a mask; and removing the lift off layer and the photoresist layer.

The forming of the intermediate layer may include allowing the material of the intermediate layer to be incident on the exposed portions of the pixel electrode and the pixel-defining layer by at least a first degree; and the depositing of the material of the protective layer may include allowing the material of the protective layer to be incident on the intermediate layer by at least a second degree less than the first degree, wherein the first degree is a minimum value of an angle between a direction parallel to the substrate and a direction in which the material of the intermediate layer is incident, and the second degree is a minimum value of an angle between the direction parallel to the substrate and a direction in which the material of the protective layer is incident.

The first degree may be greater than the second degree by about 5 degrees.

The forming of the pixel electrode may include forming a first pixel electrode, a second pixel electrode, and a third pixel electrode that are spaced apart from each other on the substrate; and the forming of the intermediate layer and the forming of the protective layer may include depositing a first intermediate layer on the first pixel electrode, the first intermediate layer emitting light with a first color; depositing a first protective layer on the first intermediate layer; depositing a second intermediate layer on the second pixel electrode, the second intermediate layer emitting light with a second color; depositing a second protective layer on the second intermediate layer; depositing a third intermediate layer on the third pixel electrode, the third intermediate layer emitting light with a third color; and depositing a third protective layer on the third intermediate layer, the first intermediate layer, the second intermediate layer, and the third intermediate layer being spaced apart from each other, and the first protective layer, the second protective layer, and the third protective layer being spaced apart from each other.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
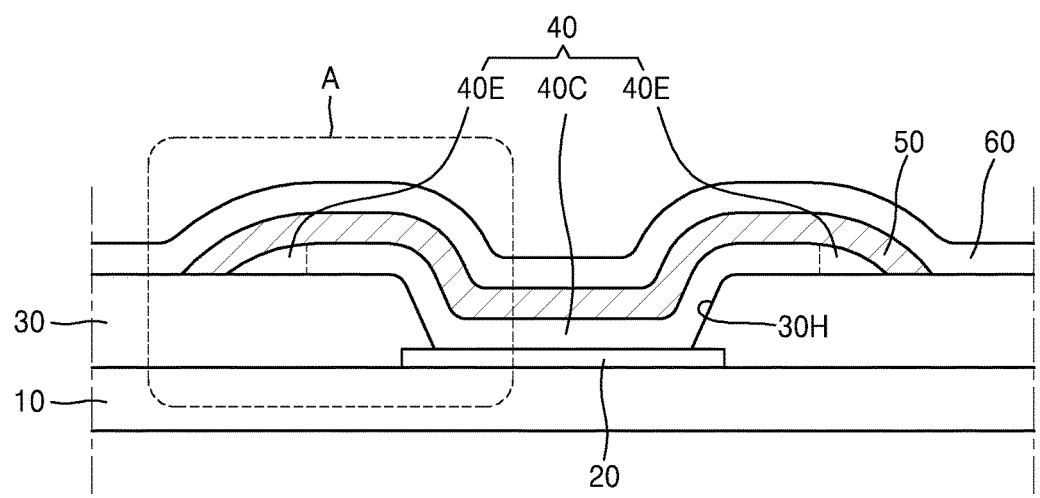
FIG. 1 is a cross-sectional view of an organic light-emitting display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "cover," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
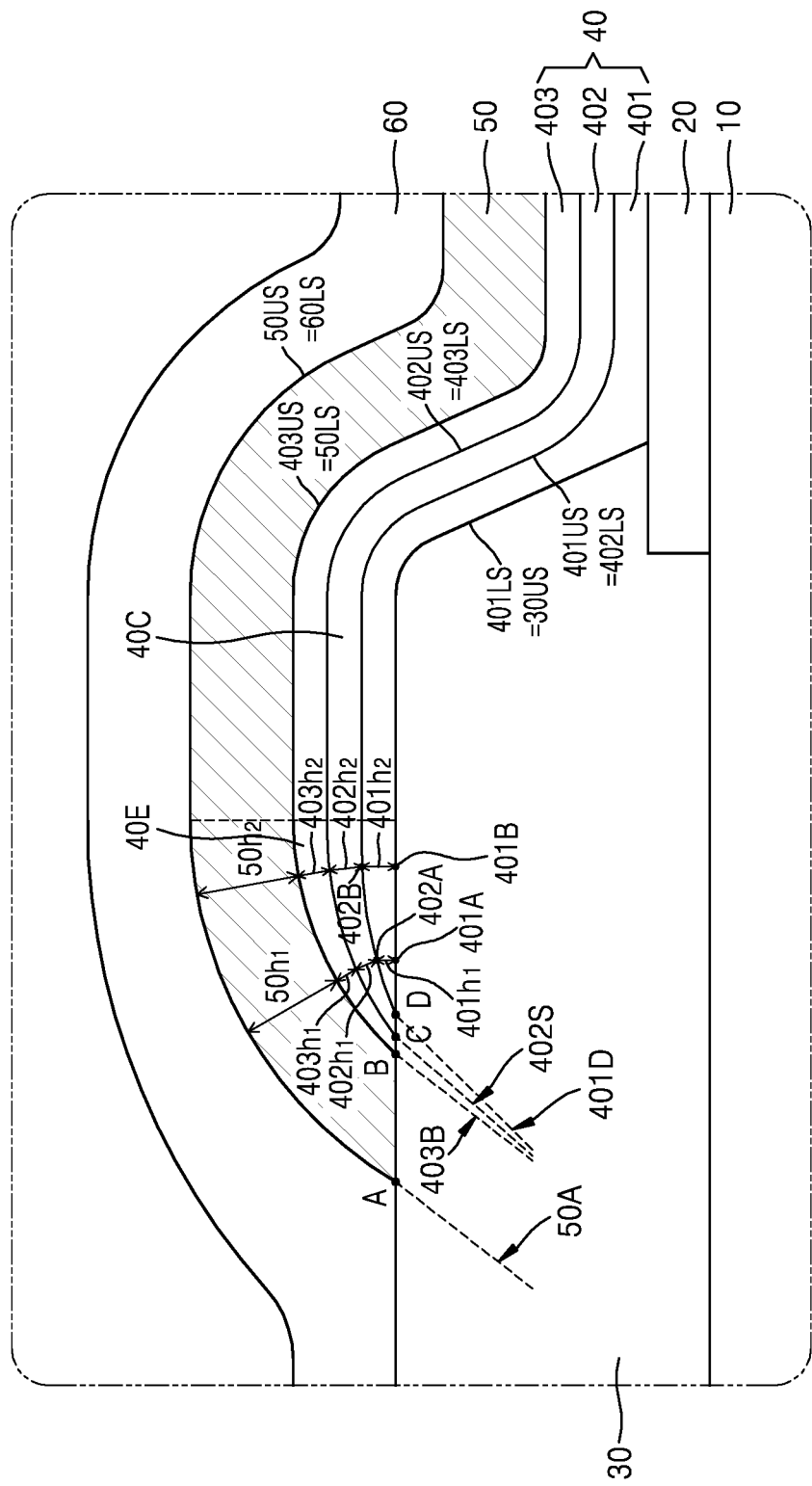
FIGS. 2 and 3 are cross-sectional views of a magnified portion A of the organic light-emitting display apparatus of FIG. 1.
Figure 3:
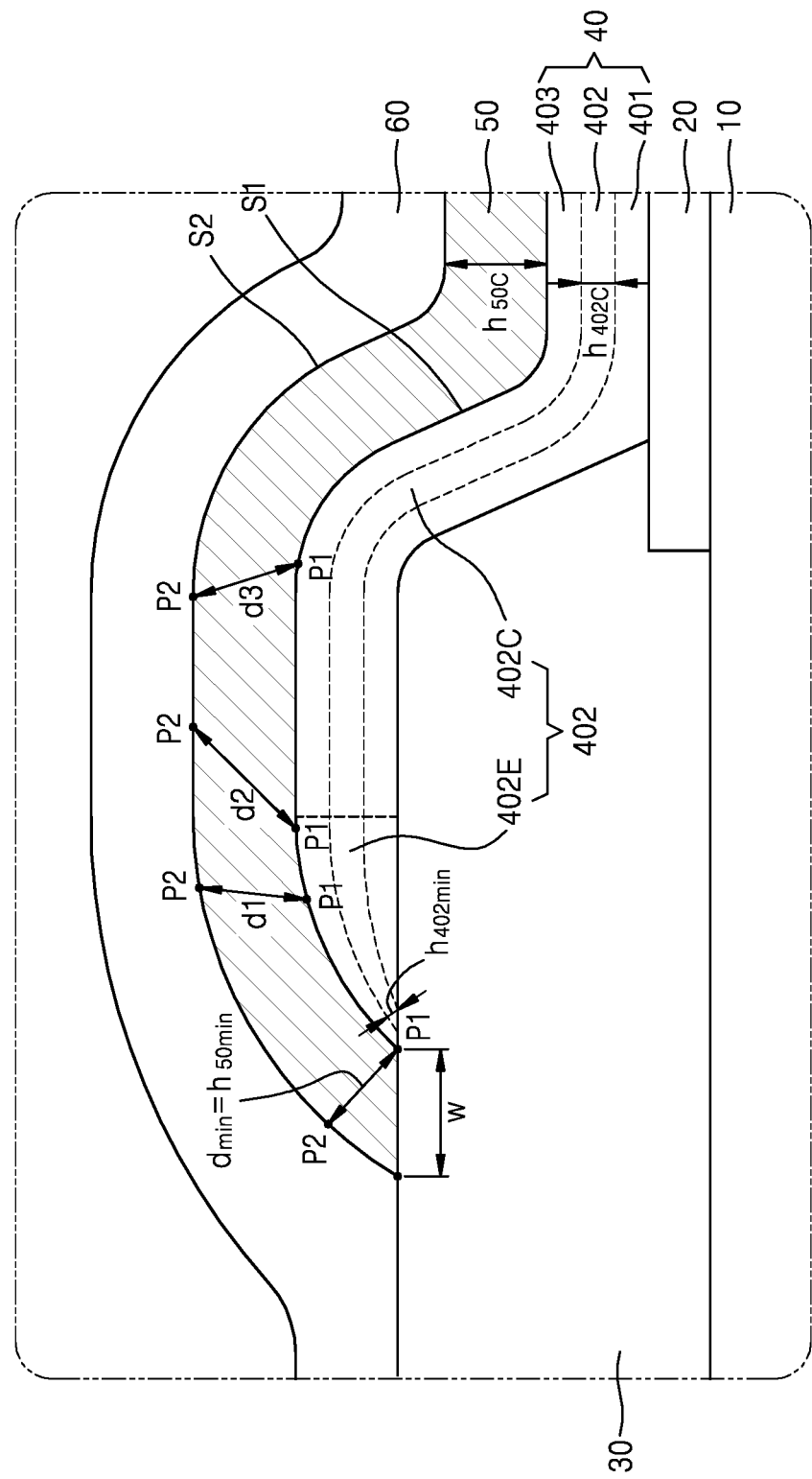

FIG. 1 is a cross-sectional view of an organic light-emitting display apparatus according to an exemplary embodiment. FIGS. 2 and 3 are cross-sectional views of a magnified portion A of the organic light-emitting display apparatus.

Referring to FIGS. 1 through 3, the organic light-emitting display apparatus according to the present exemplary embodiment may include a substrate 10; a pixel electrode 20 on the substrate 10; a pixel-defining layer 30 including an opening 30H exposing at least a portion of the pixel electrode 20; an intermediate layer 40 including a center area 40C on the pixel electrode 20 and side areas 40E extending from the center area 40C and arranged on the pixel-defining layer 30, the intermediate layer 40 including one or more common layers 401 and 403 (also referred to as the first and second common layers 401 and 403) and an emission layer 402; a protective layer 50 covering top surfaces of the center area 40C and the side areas 40E of the intermediate layer 40 and exposing at least a portion of the pixel-defining layer 30; and an opposite electrode 60 on the protective layer 50 and portions of the pixel-defining layer 30, the portions being exposed by the protective layer 50, and the opposite electrode 60 being spaced apart from the intermediate layer 40 by the protective layer 50.

The substrate 10 may include various materials. For example, the substrate 10 may include various materials such as a glass material, a metal material, a plastic material, or the like.

A buffer layer (not shown) including inorganic materials such as silicon oxide, silicon nitride and/or silicon oxynitride may be above the substrate 10. The buffer layer may improve planarization of a top surface of the substrate 10, or may prevent or minimize penetration of impurities from the substrate 10 into an active layer (not shown) of a thin film transistor (TFT) (not shown). If required, the buffer layer may be omitted.

The TFT is arranged above the substrate 10 so as to control emission of each pixel. The TFT may include the active layer including a semiconductor material such as amorphous silicon, polysilicon, an oxide semiconductor, an organic semiconductor material, or the like, a gate electrode (not shown) insulated from the active layer, and source and drain electrodes (not shown) that are electrically connected to the active layer.

A via insulating layer (not shown) covering the TFT may be arranged above the TFT. The via insulating layer may have a flat top surface allowing the pixel electrode 20 to be formed flat thereon. The via insulating layer may include an organic material such as acryl, benzocyclobutene (BCB), polyimide, hexamethyldisiloxane (HMDSO), or the like.

The pixel electrode 20 electrically connected to the TFT is above the via insulating layer. The pixel electrode 20 has an island form that is separated in each pixel. The pixel electrode 20 may be formed as a reflective electrode. The pixel electrode 20 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent conductive layer disposed above and/or below the reflective layer. The transparent conductive layer may include at least one of indium zinc oxide (ITO), indium zinc oxide (IZO), zinc oxide (ZnO), indium oxide ($In_2O_3$), indium gallium oxide (IGO), and aluminum zinc oxide (AZO).

The pixel-defining layer 30 having the opening 30H exposing at least a portion of the pixel electrode 20 is on the pixel electrode 20. The pixel-defining layer 30 may include, but is not limited to, an organic material such as polyimide (PI), hexamethyldisiloxane (HMDSO), or the like. The pixel-defining layer 30 may be formed as a single layer or a multi-stack layer.

The intermediate layer 40 including the one or more common layers 401 and 403 and the emission layer 402 is on the pixel electrode 20 exposed by the pixel-defining layer 30. The intermediate layer 40 includes the center area 40C and the side areas 40E. In this regard, each of the side areas 40E indicates an area of the intermediate layer 40 in which a height of the intermediate layer 40 decreases in a direction away from the center area 40C. The center area 40C indicates an area that is not the side areas 40E of the intermediate layer 40. Side areas of each layer included in the intermediate layer 40 may be defined by using a similar method. The side areas 40E of the intermediate layer 40 may be on the pixel-defining layer 30 and thus may contact the pixel-defining layer 30. The center area 40C of the intermediate layer 40 may cover the pixel electrode 20 and portions of the pixel-defining layer 30.

The emission layer 402 may include a small-molecule or polymer material. When the emission layer 402 includes the small-molecule material, the intermediate layer 40 may have a structure in which a hole injection layer (HIL), a hole transport layer (HTL), an emission layer, an electron transport layer (ETL), an electron injection layer (EIL), and the like are singularly or multiply stacked. Referring to FIG. 2, the first common layer 401, the emission layer 402, and the second common layer 403 are sequentially stacked from the bottom. In this regard, the first common layer 401 may be the HIL and/or the HTL, and the second common layer 403 may be the ETL and/or the EIL. The emission layer 402 may include various organic materials including copper phthalocyanine (CuPc), N,N'-Di(naphthalene-1-yl)-N,N'-diphenyl-benzidine (NPB), tris-8-hydroxyquinoline aluminum) (Alq3), and the like.

When the emission layer 402 includes the polymer material, the intermediate layer 40 may have a structure including the first common layer 401 generally including the HTL, and the emission layer 402. In this regard, the HTL may include poly-(2,4)-ethylene-dihydroxy thiophene (PEDOT), and the emission layer 402 may include poly-phenylene vinylene (PPV)-based polymer materials, polyfluorene-based polymer materials, and the like.

The protective layer 50 that covers the top surfaces of the center area 40C and the side areas 40E is on the intermediate layer 40. The protective layer 50 exposes at least a portion of the pixel-defining layer 30. The protective layer 50 has an island form that is separated in each pixel.

FIG. 2 particularly illustrates a structure of the side area 40E of the intermediate layer 40. Referring to FIG. 2, the first common layer 401 between the pixel electrode 20 and the emission layer 402 and the second common layer 403 between the emission layer 402 and the protective layer 50 are each a single layer, but the present disclosure is not limited thereto. The first common layer 401 may be the HIL and/or the HTL, and the second common layer 403 may be the ETL and/or the EIL.

According to the present exemplary embodiment, thicknesses of the first and second common layers 401 and 403 and the emission layer 402 included in the side area 40E of the intermediate layer 40 may decrease in a direction away from the center area 40C throughout the side area 40E. In this regard, a distance between a point of a lower surface (LS) of each layer and another point at a position contacting the upper surface (US) of each layer and perpendicular to the LS, is defined as a thickness at the point.

Referring to FIG. 2, thicknesses at two points 401A and 401B on a surface 401LS or 30US between the pixel-defining layer 30 and the first common layer 401 are indicated by using reference numerals $401h_1$ and $401h_2$. A light that is drawn from the point 401A in a manner perpendicular to the surface 401LS meets the point 402A on a surface 401US. In this regard, a distance $401h_1$ between the point 401A and the point 402A is the thickness at the point 401A. Similarly, a distance $401h_2$ between the point 401B and the point 402B is the thickness at the point 401B.

In the same manner, thicknesses $402h_1$ and $402h_2$ respectively at two points of the emission layer 402, thicknesses $403h_1$ and $403h_2$ respectively at two points of the second common layer 403, and thicknesses $50h_1$ and $50h_2$ respectively at two points of the protective layer 50 are shown in FIG. 2.

In this regard, thicknesses of the first common layer 401, the emission layer 402, and the second common layer 403 decrease in a direction from the center area 40C throughout the side area 40E. That is, the thickness $401h_2$ is greater than the thickness $401h_1$, the thickness $402h_2$ is greater than the thickness $402h_1$, and the thickness $403h_2$ is greater than the thickness $403h_1$. On the other hand, a thickness of the protective layer 50 may not decrease in a direction away from the center area 40C of the intermediate layer 40.

According to the present exemplary embodiment, the protective layer 50 with a substantially uniform thickness may cover the side areas 40E of the intermediate layer 40. Referring to FIG. 2, thicknesses of the protective layer 50 at all points on a surface between the protective layer 50 and the side area 40E of the intermediate layer 40 may be substantially uniform. That is, a value of a thickness $50h2$ and a value of a thickness $50h1$ may be substantially equal to each other.

According to the present exemplary embodiment, the thickness of the protective layer 50 may decrease in the direction from the center area 40C throughout the side area 40E. As will be described later, the intermediate layer 40 and the protective layer 50 are formed through deposition processes performed in a same way, so that, as the thickness of the intermediate layer 40 decreases in the side area 40E, the thickness of the protective layer 50 covering the side area 40E may decrease in a direction away from the center area 40C. However, in this case, a percentage of the decrease of the thickness of the protective layer 50 may be less than a percentage of the decrease of the thickness of the intermediate layer 40. In this regard, a percentage of the decrease of a thickness indicates a percentage by which a thickness of each layer decreases in a direction away from the center area 40C.

According to the present exemplary embodiment, a minimum thickness of the protective layer 50 may be equal to or greater than 50 Å.

The present disclosure provides the organic light-emitting display apparatus and a method of manufacturing the organic light-emitting display apparatus in which the occurrence of a defective pixel is decreased because, when the minimum thickness of the protective layer 50 is equal to or greater than a predetermined value, damage to the intermediate layer 40 including the emission layer 402 is prevented.

Referring back to FIG. 2, a point where a lower surface 60LS of the opposite electrode 60 or an upper surface 50US of the protective layer 50 contacts an upper surface 30US of the pixel-defining layer 30 is marked as A, a point where a lower surface 50LS of the protective layer 50 or an upper surface 403US of the second common layer 403 contacts the upper surface 30US of the pixel-defining layer 30 is marked as B, a point where a lower surface 403LS of the second common layer 403 or an upper surface 402US of the emission layer 402 contacts the upper surface 30US of the pixel-defining layer 30 is marked as C, and a point where a lower surface 402LS of the emission layer 402 or an upper surface 401US of the first common layer 401 contacts the upper surface 30US of the pixel-defining layer 30 is marked as D. At the points A, B, C, and D, respectively, surfaces contacting the upper surface 30US are respectively parallel to the surfaces indicated by reference numerals 50A, 403B, 402S, and 401D.

According to the present exemplary embodiment, since the protective layer 50 has the substantially uniform thickness, the surface 50A and the surface 403B are substantially parallel to each other. On the other hand, the thicknesses of the second common layer 403, the emission layer 402, and the first common layer 401 decrease in a direction away from the center area 40C, so that an angle between the surfaces 403B and 402S, and an angle between the surfaces 402S and 401D, are each greater than an angle between the surfaces 50A and 403B.

According to the present exemplary embodiment, a difference between a thickness of the emission layer 402 at the center area 40C and a minimum thickness of the emission layer 402 may be greater than a difference between a thickness of a portion of the protective layer 50 covering the center area 40C of the intermediate layer 40 and a minimum thickness of another portion of the protective layer 50 covering the side area 40E of the intermediate layer 40.

Referring to FIG. 3, a thickness of a center area 402C of the emission layer 402 is marked as $h_{402c}$, a minimum thickness of the emission layer 402 is marked as $h_{402min}$, a thickness of a portion of the protective layer 50 covering the center area 40C of the intermediate layer 40 is marked as $h_{50c}$, and a minimum thickness of a portion of the protective layer 50 covering the side area 40E of the intermediate layer 40 is marked as $h_{50min}$. Due to deposition processes to be described below, a thickness of the emission layer 402 decreases in a side area 402E of the emission layer 402 in a direction away from the center area 402C, and thus, a thickness of the emission layer 402 generally has the minimum thickness $h_{402min}$ at a point where the emission layer 402 contacts the pixel-defining layer 30.

On the other hand, the thickness of the protective layer 50 on the center area 40C and the side area 40E is substantially uniform such that a difference between the thicknesses $h_{50c}$ and $h_{50min}$ is close to 0 or is as small as several % of the thickness $h_{50c}$. However, the thickness of the emission layer 402 decreases at the side area 402E such that a difference between the thicknesses $h_{402c}$ and $h_{402min}$ is as large as several to several tens of % of the thickness $h_{402c}$.

According to an exemplary embodiment, a ratio ($h_{402c}$-$h_{402min}$)/$h_{402min}$ of a difference between the thickness of the center area 402C of the emission layer 402 and the minimum thickness of the emission layer 402 to the minimum thickness of the emission layer 402 is greater than a ratio ($h_{50c}$-$h_{50min}$)/$h_{50min}$ of a difference between the thickness of the portion of the protective layer 50 covering the center area 40C of the intermediate layer 40 and the minimum thickness of the portion of the protective layer 50 covering the side area 40E of the intermediate layer 40 to the minimum thickness of the portion of the protective layer 50 covering the side area 40E of the intermediate layer 40.

The opposite electrode 60 is on the protective layer 50, and also on portions of the pixel-defining layer 30 that are exposed by the protective layer 50. The opposite electrode 60 is spaced apart from the intermediate layer 40 by the protective layer 50. That is, the opposite electrode 60 does not physically contact the intermediate layer 40. Unlike the pixel electrode 20, the opposite electrode 60 may be formed as one body extending over all pixels and thus may correspond to the pixel electrodes 20.

The opposite electrode 60 may be a transflective electrode or a transmissive electrode, and may be formed as a thin metal film of several to several tens of nanometers so as to transmit light. For example, the opposite electrode 60 may include Ag, Al, Mg, Li, Ca, Cu, LiF/Ca, LiF/Al, MgAg, CaAg, or a compound thereof. The opposite electrode 60 may include a transparent conductive material such as ITO, IZO, ZnO, $In_2O_3$, IGO, AZO, or the like.

When the pixel electrode 20 is formed as the reflective electrode, and the opposite electrode 60 is formed as the transflective electrode or the transmissive electrode as described above, it is possible to embody a top-emission type organic light-emitting display apparatus in which light from the emission layer 402 passes through the opposite electrode 60 and is then discharged to the outside of the organic light-emitting display apparatus.

According to an exemplary embodiment, the protective layer 50 may include a conductive material as that of the opposite electrode 60. The conductive material may include Al, Mg, Li, Ca, Cu, LiF/Ca, LiF/Al, MgAg, CaAg, or a compound thereof. In this regard, the protective layer 50 may be formed as a thin metal film of several to several tens of nanometers so as to transmit light. The protective layer 50 may include a transparent conductive material such as ITO, IZO, ZnO, $In_2O_3$, IGO, AZO, or the like. The protective layer 50 and the opposite electrode 60 may have different materials, provided that both the protective layer 50 and the opposite electrode 60 include the conductive material.

Referring back to FIG. 3, the intermediate layer 40 and the opposite electrode 60 are spaced apart from each other by the protective layer 50. In this regard, when there are points P1 on a surface S1 between the intermediate layer 40 and the protective layer 50, and points P2 on a surface S2 between the protective layer 50 and the opposite electrode 60, there is a minimum value from among distances respectively between points P1 and the points P2. Referring to FIG. 3, four distances $d_{min}$, d1, d2, and d3 are illustrated, and among them, $d_{min}$ indicates the minimum value from among the distances between the points P1 and the points P2. In this regard, $d_{min}$ is equal to the minimum thickness of the protective layer 50, $h_{50min}$.

That is, there is the minimum value $d_{min}$ from among distances between the intermediate layer 40 and the opposite electrode 60, and according to an exemplary embodiment, the minimum value $d_{min}$ may be between about 50 Å and about 1000 Å.

On the other hand, if the minimum value $d_{min}$ from among the distances between the intermediate layer 40 and the opposite electrode 60 is less than 50 Å, in a lift off process to be described below, a solvent functioning as a stripper for removing a lift off layer may penetrate into the intermediate layer 40 including the emission layer 402, and more particularly, the solvent may penetrate into the side area 40E of the intermediate layer 40. That is, the present disclosure may provide the organic light-emitting display apparatus and a method of manufacturing the organic light-emitting display apparatus in which the occurrence of a defective pixel is decreased because, when the thickness of the protective layer 50 is equal to or greater than a predetermined value, damage to the intermediate layer 40 including the emission layer 402 is prevented.

However, when the thickness of the protective layer 50 is too large, light generated in the emission layer 402 cannot pass through the protective layer 50, and a deposition time is increased, which means that a manufacturing time of the organic light-emitting display apparatus is increased such that productivity deteriorates. When the protective layer 50 is formed as the thin metal film, if the thickness of the protective layer 50 is greater than 300 Å, light may not pass through the protective layer 50. When the protective layer 50 includes the transparent conductive material such as ITO, IZO, ZnO, $In_2O_3$, IGO, AZO, or the like, if the thickness of the protective layer 50 is greater than about 1000 Å, the protective layer 50 absorbs a large amount of light, and thus, the light may not pass through the protective layer 50.

According to an exemplary embodiment, the protective layer 50 may include an area that directly contacts the pixel-defining layer 30. Since the protective layer 50 includes the area that directly contacts the pixel-defining layer 30, the opposite electrode 60 and the intermediate layer 40 may be spaced apart from each other. The present disclosure may provide the organic light-emitting display apparatus and a method of manufacturing the organic light-emitting display apparatus in which the occurrence of a defective pixel is decreased because, when a width w of the area of the protective layer 50 contacting the pixel-defining layer 30 is greater than a predetermined value, damage to the intermediate layer 40 including the emission layer 402 is prevented. Since the minimum thickness of the protective layer 50 is equal to or greater than about 50 Å, the width w of the contact area is also equal to or greater than about 50 Å.

Hereinafter, with reference to FIGS. 4A through 4G, the method of manufacturing the organic light-emitting display apparatus of FIG. 1 is described.

Referring to FIGS. 4A through 4G, the method of manufacturing the organic light-emitting display apparatus, according to an exemplary embodiment, includes forming the pixel electrode 20 on the substrate 10; forming the pixel-defining layer 30 including the opening 30H exposing at least a portion of the pixel electrode 20; forming the intermediate layer 40, which includes the one or more common layers 401 and 403 and the emission layer 402, on the pixel electrode 20 and the pixel-defining layer 30; forming, on the intermediate layer 40, the protective layer 50 exposing at least a portion of the pixel-defining layer 30; and forming the opposite electrode 60 on the protective layer 50 and portions of the pixel-defining layer 30, the portions being exposed by the protective layer 50, and the opposite electrode 60 being spaced apart from the intermediate layer 40 by the protective layer 50.

Figure 4A:
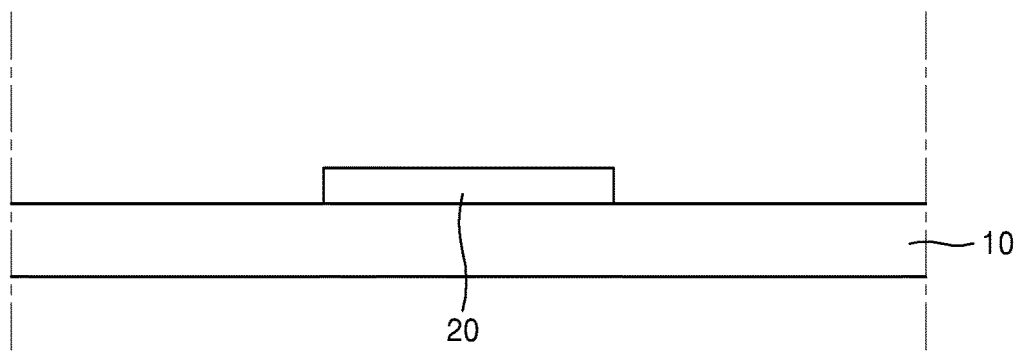
FIGS. 4A through 4G are cross-sectional views sequentially showing a method of manufacturing the organic light-emitting display apparatus of FIG. 1.

Referring to FIG. 4A, the pixel electrode 20 is formed on the substrate 10. The pixel electrode 20 has an island form that is separated in each pixel. The pixel electrode 20 may be formed as a reflective electrode. The pixel electrode 20 may include a reflective layer including Ag, Mg, Al, Pt, Pd, Au, Ni, Nd, Ir, Cr, or a compound thereof, and a transparent conductive layer disposed above and/or below the reflective layer. The transparent conductive layer may include at least one of ITO, IZO, ZnO, $In_2O_3$, IGO, and AZO.

Although not illustrated in FIG. 4A, before forming the pixel electrode 20, the method may include forming a buffer layer (not shown) on the substrate 10 and forming, on the buffer layer, a thin-film transistor (not shown) electrically connected to the pixel electrode 20.

Figure 4B:
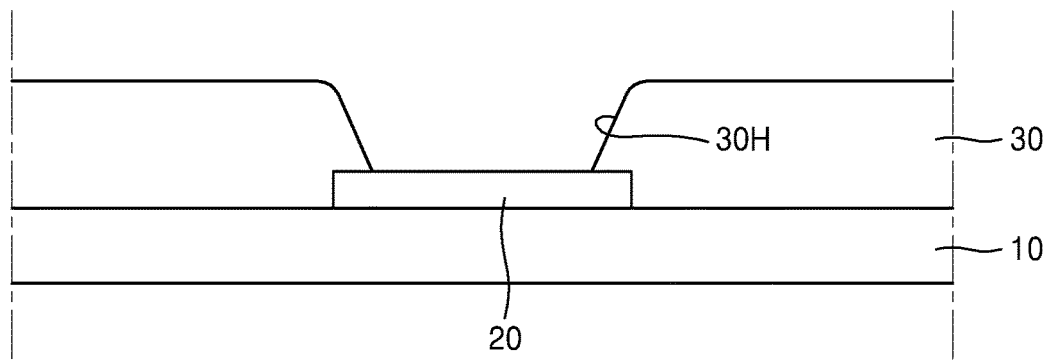

Referring to FIG. 4B, the pixel-defining layer 30 is formed on the pixel electrode 20. The pixel-defining layer 30 may cover edges of the pixel electrode 20 having the island form, and may include the opening 30H exposing at least a portion of the pixel electrode 20. That is, the pixel-defining layer 30 is formed so as to surround the edges of the pixel electrode 20, and the opening 30H of the pixel-defining layer 30 may define a pixel by exposing a center portion of the pixel electrode 20.

Figure 4C:
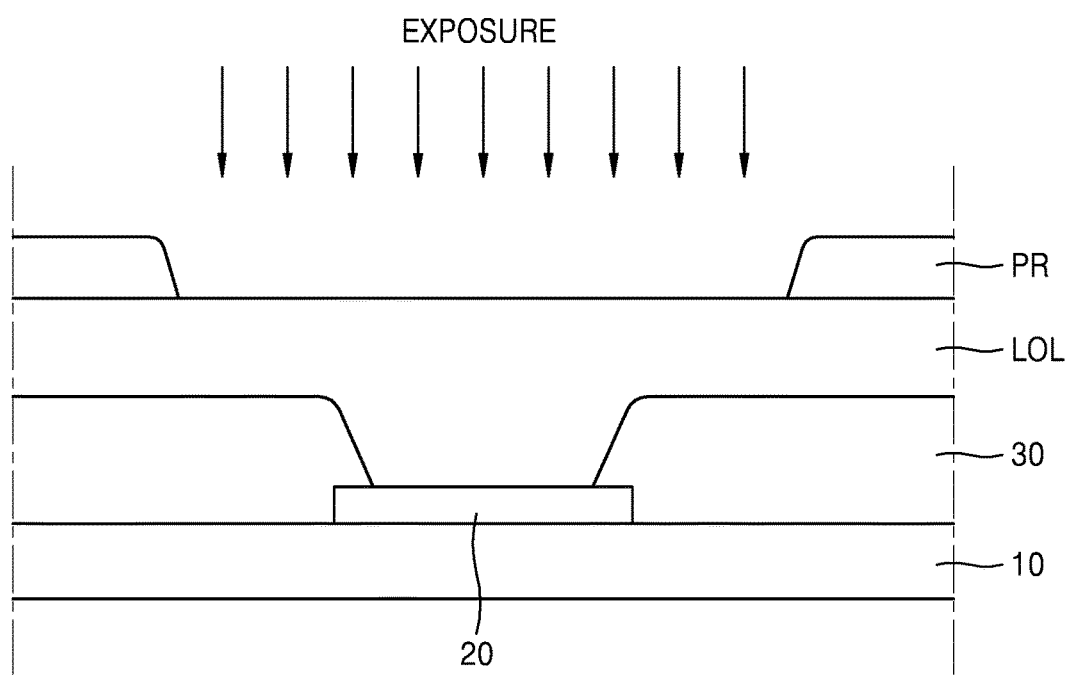

Referring to FIG. 4C, a lift off layer LOL is formed over the substrate 10 on which the pixel electrode 20 is formed. The intermediate layer 40 including the emission layer 402 is formed after the pixel-defining layer 30 is formed, and the lift off layer LOL has low chemical reactivity with the intermediate layer 40. For example, the lift off layer LOL may include a fluoropolymer having low chemical reactivity with a material included in the intermediate layer 40.

The fluoropolymer included in the lift off layer LOL may be formed of a polymer having a fluorine level of 20-60 wt %. For example, the fluoropolymer included in the lift off layer LOL may include at least one of a copolymer of polytetrafluoroethylene, polychlorotrifluoroethylene, polydichlorodifluoroethylene, chlorotrifluoroethylene, and dichlorodifluoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, and a copolymer of chlorotrifluoroethylene and perfluoroalkylvinylether.

The lift off layer LOL may be formed over the substrate 10 by using one of a coating method, a printing method, a deposition method, or the like. When the lift off layer LOL is formed by using the coating method and the printing method, a process of performing a curing treatment and/or a polymerizing treatment and then forming a photoresist layer PR may be performed, if required.

A thickness of the lift off layer LOL may be between about 0.2 μm and about 5 μm. If the thickness of the lift off layer LOL is too large, a time taken to melt the lift off layer LOL so as to pattern the lift off layer LOL is increased, and thus a manufacturing time may be increased. If the thickness of the lift off layer LOL is too small, it is difficult to perform a lift off process.

Afterward, the photoresist layer PR is formed on the lift off layer LOL. A photoresist is coated entirely over the lift off layer LOL, and then a portion of the photoresist overlapping the pixel electrode 20 is exposed by using a photomask (not shown) and is developed. In this regard, the photoresist may be a positive-type photoresist or a negative-type photoresist. FIG. 4C illustrates the positive-type photoresist. Through the procedure, the portion of the photoresist overlapping the pixel electrode 20 is removed, so that the photoresist layer PR is formed.

Figure 4D:
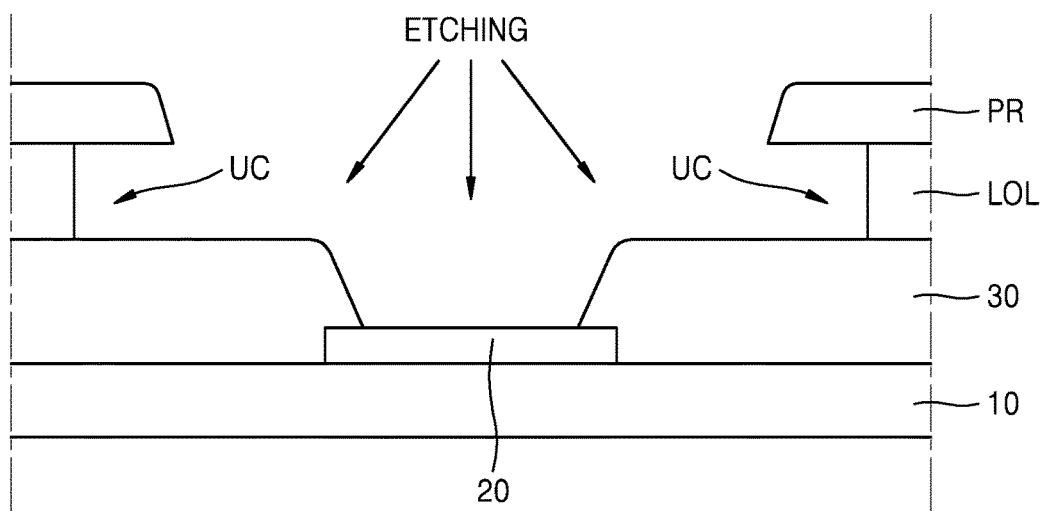

Referring to FIG. 4D, the lift off layer LOL is etched by using the patterned photoresist layer PR as an etching mask. When the lift off layer LOL includes the fluoropolymer, a solvent capable of etching the fluoropolymer is used as an etching solution. For example, a first solvent (not shown) including fluorine may be used as the etching solution. The first solvent may include a hydrofluoroether. The hydrofluoroether has low reactivity with another material and thus is electrochemically stable, and also, the hydrofluoroether has a low global warming factor and low toxicity, and thus is environmentally stable.

Through the etching process, a material of the lift off layer LOL, which is under the area of the photoresist that was developed and thus removed, is removed so that portions of the pixel electrode 20 and the pixel-defining layer 30 are exposed. When the lift off layer LOL is etched, the first solvent forms an undercut profile UC in the lift off layer LOL.

The undercut profile UC may enable an exact deposition pattern with respect to the intermediate layer 40 including the emission layer 402, and may clearly remove the remaining lift off layer LOL on the substrate 10 in a lift off process to be described below. Referring to FIG. 4D, since the lift off layer LOL has been undercut, edges of the photoresist layer PR project further toward the pixel electrode 20 than edges of the lift off layer LOL.

Figure 4E:
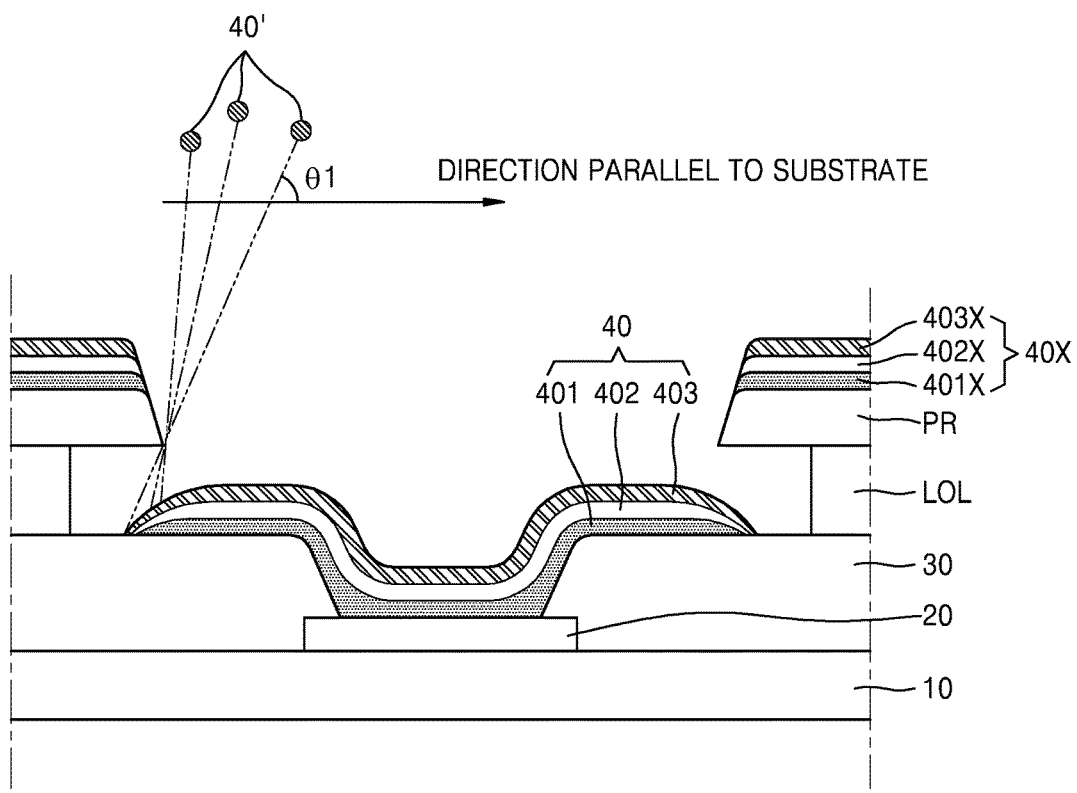

Referring to FIG. 4E, the intermediate layer 40 including the first common layer 401, the emission layer 402, and the second common layer 403 is formed on the pixel electrode 20. The first common layer 401 may be the HTL and/or the HIL, and the second common layer 403 may be the EIL and/or the ETL, but the present disclosure is not limited thereto, and the first common layer 401 and the second common layer 403 may each further include another functional layer. In addition, at least one of the first common layer 401 and the second common layer 403 may not be formed.

The intermediate layer 40 may be formed through a deposition process, and during the deposition process, the lift off layer LOL and the photoresist layer PR may function as a mask. In this regard, since a direction in which a deposition material from a deposition source may not be perpendicular to the substrate 10, the intermediate layer 40 may be formed overlapping the edges of the photoresist layer PR that project further toward the pixel electrode 20 than the edges of the lift off layer LOL. Through the deposition process with respect to the intermediate layer 40, a material layer 40X forming the intermediate layer 40 may be formed on the photoresist layer PR.

When the intermediate layer 40 is formed on the pixel electrode 20, an angle (a deposition angle of the intermediate layer 40) between a direction in which a deposition material included in the intermediate layer 40 is incident and a direction parallel to the substrate 10 is changed as an intermediate layer deposition source 40' is moved or the substrate 10 is rotated. In this regard, a first angle θ1 is defined as a minimum deposition angle of the intermediate layer 40. The deposition angle of the intermediate layer 40 means an angle equal to or less than 90 degrees, the angle from among angles between directions in which the deposition material is incident and the direction parallel to the substrate 10. That is, the deposition material included in the intermediate layer 40 is incident onto the substrate 10 with at least the first angle θ1.

As described above, the edges of the photoresist layer PR may project further toward the pixel electrode 20 than the edges of the lift off layer LOL. The projecting photoresist layer PR functions as a mask, and thus, a thickness of the intermediate layer 40 decreases at a side area of the intermediate layer 40.

The forming of the intermediate layer 40 may include forming the first common layer 401, forming the emission layer 402, and forming the second common layer 403. The first common layer 401, the emission layer 402, and the second common layer 403 may be formed while a deposition angle is adjusted to have at least the first angle θ1, and thicknesses of the first common layer 401, the emission layer 402, and the second common layer 403 may decrease at their side areas. The side area of the intermediate layer 40 may correspond to an undercut area of the lift off layer LOL.

Figure 4F:
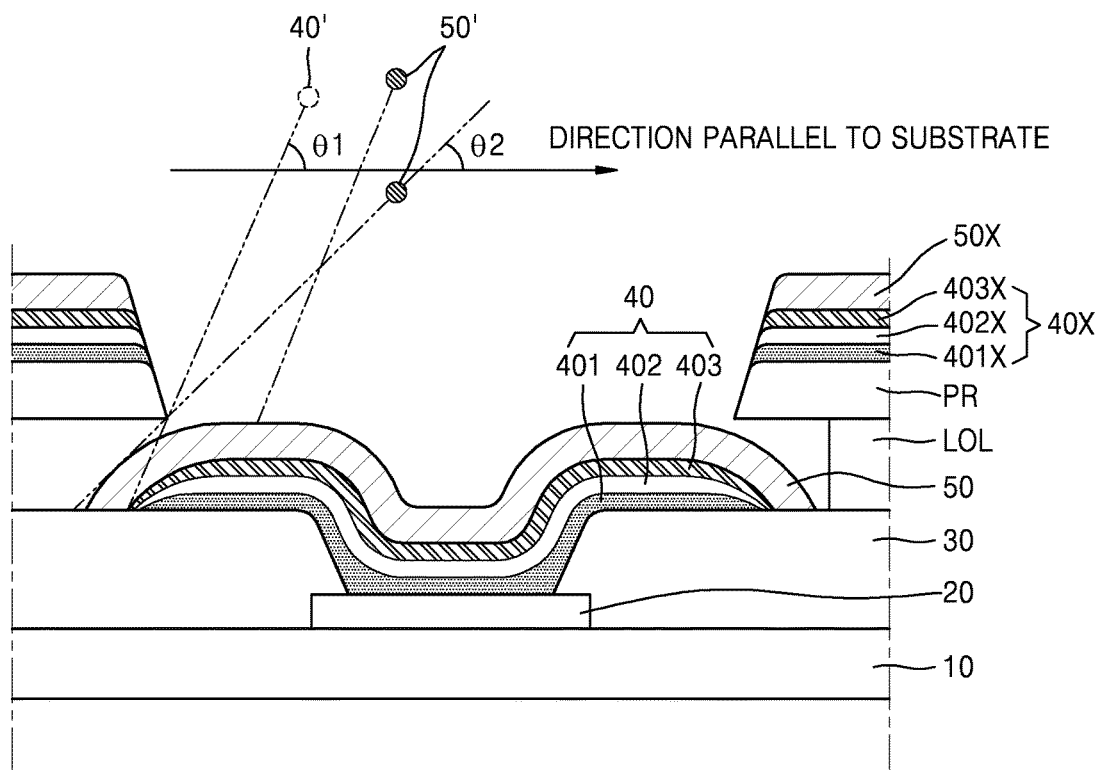

Referring to FIG. 4F, the protective layer 50 is formed on the intermediate layer 40. As for the intermediate layer 40, the protective layer 50 may also be formed through a deposition process. The protective layer 50 may completely cover the intermediate layer 40, and a material layer 50X forming the protective layer 50 may be formed above the photoresist layer PR.

Since the protective layer 50 is formed by using the lift off layer LOL and the photoresist layer PR as a mask, the protective layer 50 cannot be formed in an area of the lift off layer LOL. That is, the protective layer 50 may be formed only on a portion of the pixel-defining layer 30. That is, the protective layer 50 may be formed to expose another portion of the pixel-defining layer 30.

When the protective layer 50 is formed on the intermediate layer 40, an angle (a deposition angle of the protective layer 50) between a direction in which a deposition material included in the protective layer 50 is incident and a direction parallel to the substrate 10 changes as the protective layer deposition source 50' is moved or the substrate 10 is rotated. In this regard, a second angle θ2 is defined as a minimum value of the deposition incident angle of the protective layer 50. The deposition incident angle of the protective layer 50 means an angle equal to or less than 90 degrees, the angle from among angles between directions in which the deposition material is incident and the direction parallel to the substrate 10. That is, the deposition material included in the protective layer 50 is incident onto the substrate 10 with at least the second angle θ2.

In this regard, the second angle θ2 may be smaller than the first angle θ1, and for example, the first angle θ1 may be greater than the second angle θ2 by about 5 degrees. When the second angle θ2 is smaller than the first angle θ1 as described above, the protective layer 50 may be more deeply deposited toward the lift off layer LOL as compared with the intermediate layer 40. Therefore, the thickness of the intermediate layer 40 decreases in a direction away from the center area 40C throughout the side area 40E, but the thickness of the protective layer 50 does not decrease in a direction away from the center area 40C, and even if the thickness of the protective layer 50 decreases, a rate of decrease in the thickness of the protective layer 50 may be lower than a rate of decrease in the thickness of the intermediate layer 40.

Figure 4G:
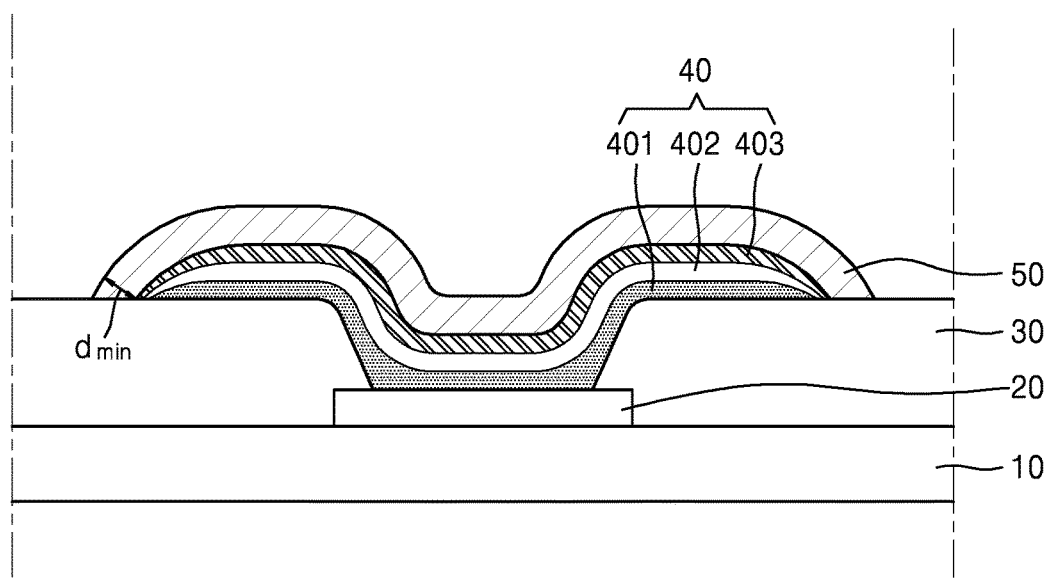

Referring to FIG. 4G, according to an exemplary embodiment, the protective layer 50 may be formed in such a manner that the minimum value $d_{min}$ of the distance between the intermediate layer 40 and the opposite electrode 60 that are spaced part from each other may be between about 50 Å and about 1000 Å.

Unlike in the aforementioned description, if the minimum value $d_{min}$ of the distance between the intermediate layer 40 and the opposite electrode 60 that are spaced part from each other is less than 50 Å, in a lift off process to be described below, the solvent functioning as the stripper for removing the lift off layer may penetrate into the intermediate layer 40 including the emission layer 402, more particularly, the solvent may penetrate into the side area 40E of the intermediate layer 40. That is, the present disclosure may provide the organic light-emitting display apparatus and a method of manufacturing the organic light-emitting display apparatus in which the occurrence of a defective pixel is decreased because, when the thickness of the protective layer 50 is equal to or greater than a predetermined value, damage to the intermediate layer 40 including the emission layer 402 is prevented.

Referring to FIG. 4G, the lift off layer LOL and the photoresist layer PR are removed by using the stripper. For example, when the lift off layer LOL includes the fluoropolymer, a second solvent (not shown) including fluorine may be used as the stripper. In this regard, since the lift off process is performed after the intermediate layer 40 and the protective layer 50 are formed, it is preferable that a material having low chemical reactivity with the intermediate layer 40 is used as the second solvent. As for the first solvent, the second solvent may include a hydrofluoroether.

When the lift off layer LOL is removed, the photoresist layer PR, the material layer 40X forming the intermediate layer 40, and the material layer 50X forming the protective layer 50 are also removed. Through the photo-patterning procedure of FIGS. 4A through 4G, the intermediate layer 40 and the protective layer 50 are formed on portions of the pixel electrode 20 and the pixel-defining layer 30.

According to an exemplary embodiment, the procedure of forming patterns of the intermediate layer 40 and the protective layer 50 is not performed through a deposition process using a metal mask (not shown) including an opening but is performed through the lift off process, so that a problem of misalignment between the substrate 10 and the metal mask may be prevented, and since the metal mask is not required, manufacturing costs may be reduced.

Referring back to FIG. 1, the opposite electrode 60 that is spaced apart from the intermediate layer 40 by the protective layer 50 is formed on the protective layer 50 and the pixel-defining layer 30 exposed by the protective layer 50.

The opposite electrode 60 may be a transflective electrode or a transmissive electrode, and may be formed as a thin metal film of several to several tens of nanometers so as to transmit light. For example, the opposite electrode 60 may include Ag, Al, Mg, Li, Ca, Cu, LiF/Ca, LiF/Al, MgAg, CaAg, or a compound thereof. The opposite electrode 60 may include a transparent conductive material such as ITO, IZO, ZnO, $In_2O_3$, IGO, AZO, or the like.

According to an exemplary embodiment, the protective layer 50 may include a same conductive material as that of the opposite electrode 60. The conductive material may include Al, Mg, Li, Ca, Cu, LiF/Ca, LiF/Al, MgAg, CaAg, or a compound thereof. In this regard, the protective layer 50 may be formed as a thin metal film of several to several tens of nanometers so as to transmit light. The protective layer 50 may include a transparent conductive material such as ITO, IZO, ZnO, $In_2O_3$, IGO, AZO, or the like. The protective layer 50 and the opposite electrode 60 may have different materials, provided that the protective layer 50 and the opposite electrode 60 include the conductive material.

When the pixel electrode 20 is formed as the reflective electrode, and the opposite electrode 60 is formed as the transflective electrode or the transmissive electrode as described above, it is possible to embody the top-emission type organic light-emitting display apparatus in which light from the emission layer 402 passes through the opposite electrode 60 and is then discharged to the outside of the organic light-emitting display apparatus.

Figure 5:
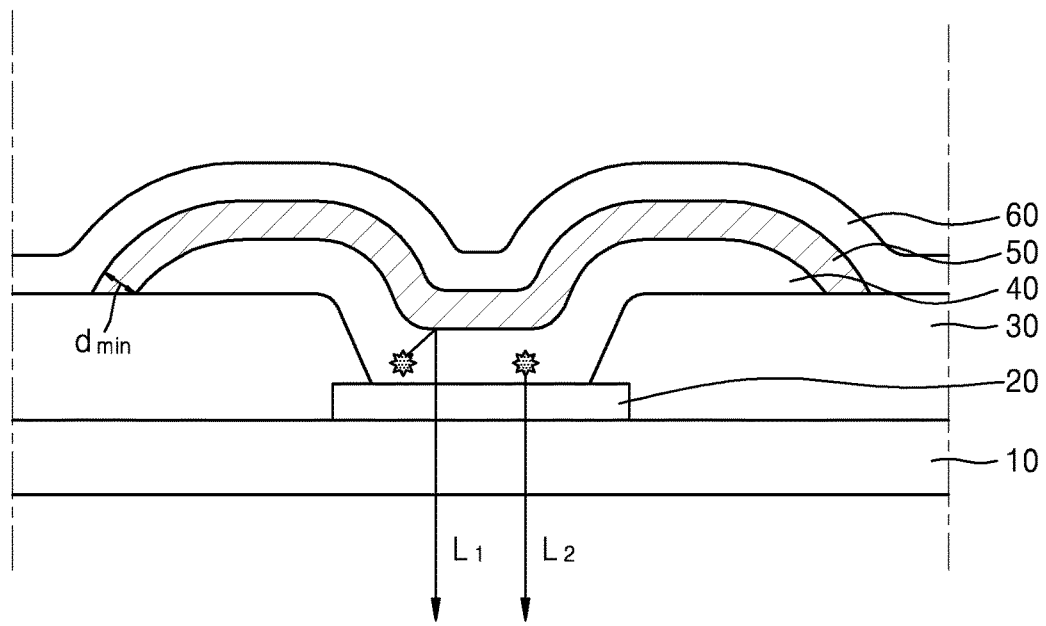
FIG. 5 is a cross-sectional view of an organic light-emitting display apparatus according to another exemplary embodiment.

FIG. 5 is a cross-sectional view of an organic light-emitting display apparatus according to another exemplary embodiment. FIG. 5 illustrates a bottom-emission type organic light-emitting display apparatus in which light emitted from the emission layer (not shown) passes through the pixel electrode 20 and is discharged to the outside of the organic light-emitting display apparatus. Referring to FIG. 5, a portion (L1) of light emitted from the emission layer (not shown) in the intermediate layer 40 is reflected from the protective layer 50 or the opposite electrode 60 and then discharged to the outside of the organic light-emitting display apparatus, and another portion (L2) of the light passes through the pixel electrode 20 without being reflected and is then discharged to the outside of the organic light-emitting display apparatus. In this regard, the pixel electrode 20 may be a transflective electrode or a transmissive electrode, and the opposite electrode 60 may be a reflective electrode.

According to an exemplary embodiment, the protective layer 50 may include a same conductive material as the opposite electrode 60. The conductive material may include Ag, Al, Mg, Li, Ca, Cu, LiF/Ca, LiF/Al, MgAg, CaAg, or a compound thereof. In this case, the protective layer 50 may include a metal material having several tens to several hundreds of nanometers in thickness to reflect light. In this regard, the protective layer 50 and the opposite electrode 60 may include different materials, provided that the protective layer 50 and the opposite electrode 60 include the conductive material.

In addition, a dual-emission type organic light-emitting display apparatus in which light emitted from the emission layer (not shown) in the intermediate layer 40 passes through both the pixel electrode 20 and the opposite electrode 60 and is then discharged to the outside of the organic light-emitting display apparatus may also be embodied.

Figure 6:
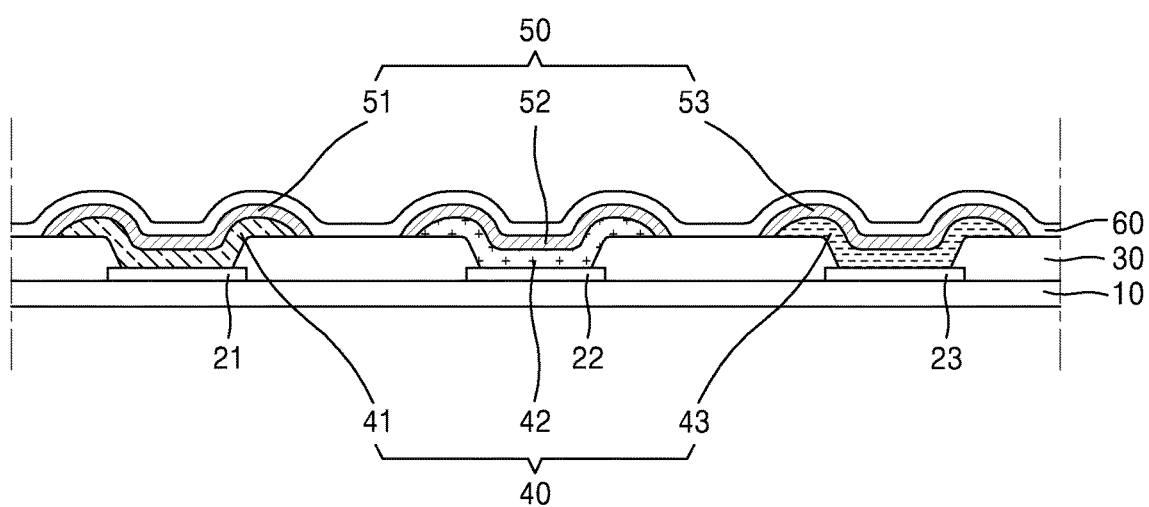
FIG. 6 is a cross-sectional view of an organic light-emitting display apparatus according to another exemplary embodiment.

FIG. 6 is a cross-sectional view of an organic light-emitting display apparatus according to another exemplary embodiment.

According to an exemplary embodiment, the pixel electrode 20 may include a first pixel electrode 21, a second pixel electrode 22, and a third pixel electrode 23 that are spaced apart from each other on the substrate 10. The intermediate layer 40 may include a first intermediate layer 41, a second intermediate layer 42, and a third intermediate layer 43 that are placed on the first pixel electrode 21, the second pixel electrode 22, and the third pixel electrode 23, respectively. The first, second, and third intermediate layers 41, 42, and 43 are spaced apart from each other.

The first intermediate layer 41 emits light with a first color, the second intermediate layer 42 emits light with a second color, and the third intermediate layer 43 emits light with a third color. For example, the first color may be red, the second color may be green, and the third color may be blue, but the present disclosure is not limited thereto and any three colors that make a white color when combined may be used. The first intermediate layer 41, the second intermediate layer 42, or the third intermediate layer 43 may include a multi-layered emission layer, to thereby emit white light.

According to an exemplary embodiment, the protective layer 50 may include a first protective layer 51 covering the first intermediate layer 41, a second protective layer 52 covering the second intermediate layer 42, and a third protective layer 53 covering the third intermediate layer 43. The first protective layer 51, the second protective layer 52, and the third protective layer 53 are spaced apart from each other. In this regard, the opposite electrode 60 that covers all of the first, second, and third protective layers 51, 52, and 53 may be formed as one body.

Figure 7A:
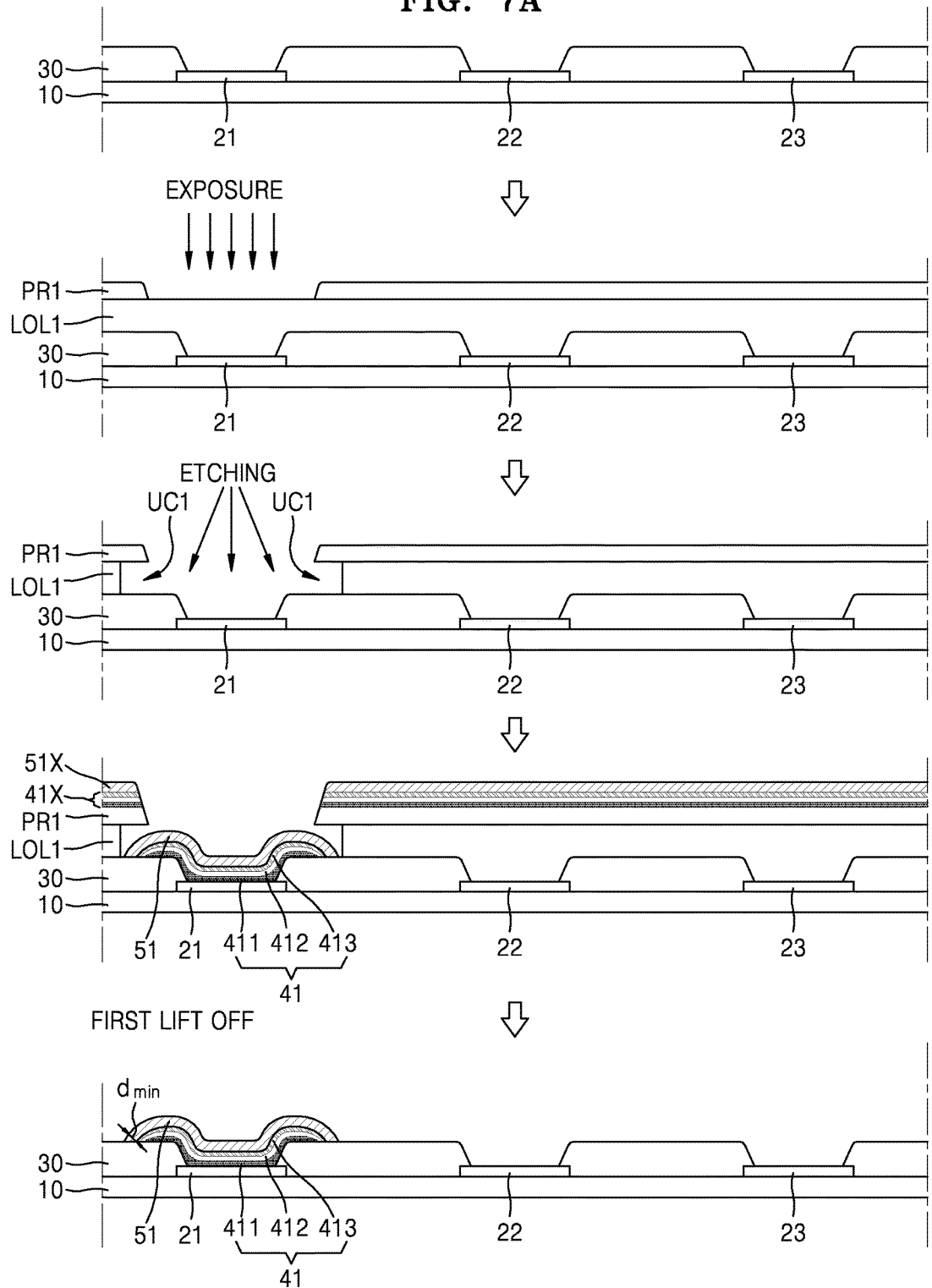
FIGS. 7A through 7C are cross-sectional views sequentially showing a method of manufacturing the organic light-emitting display apparatus of FIG. 6.
Figure 7B:
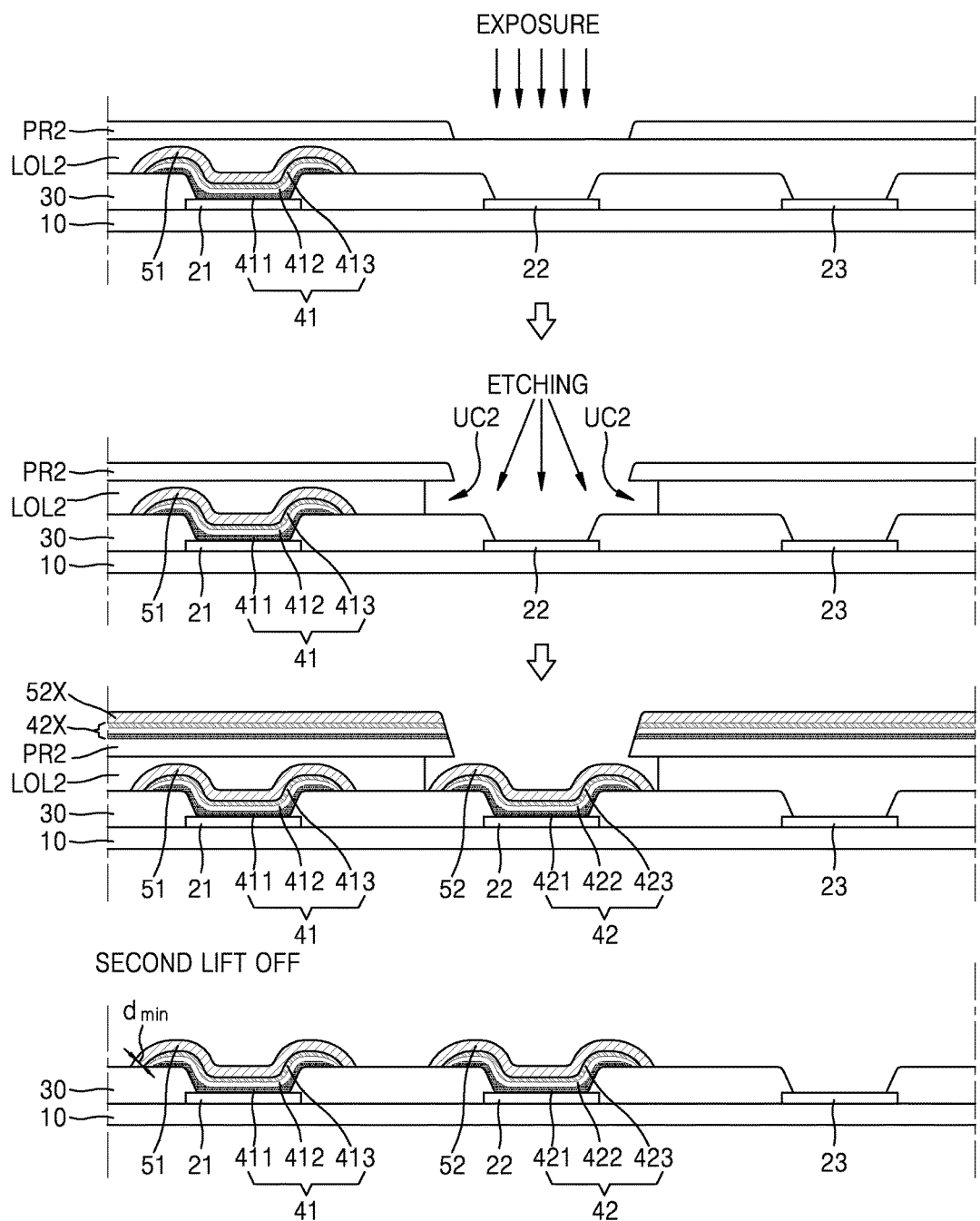
Figure 7C:
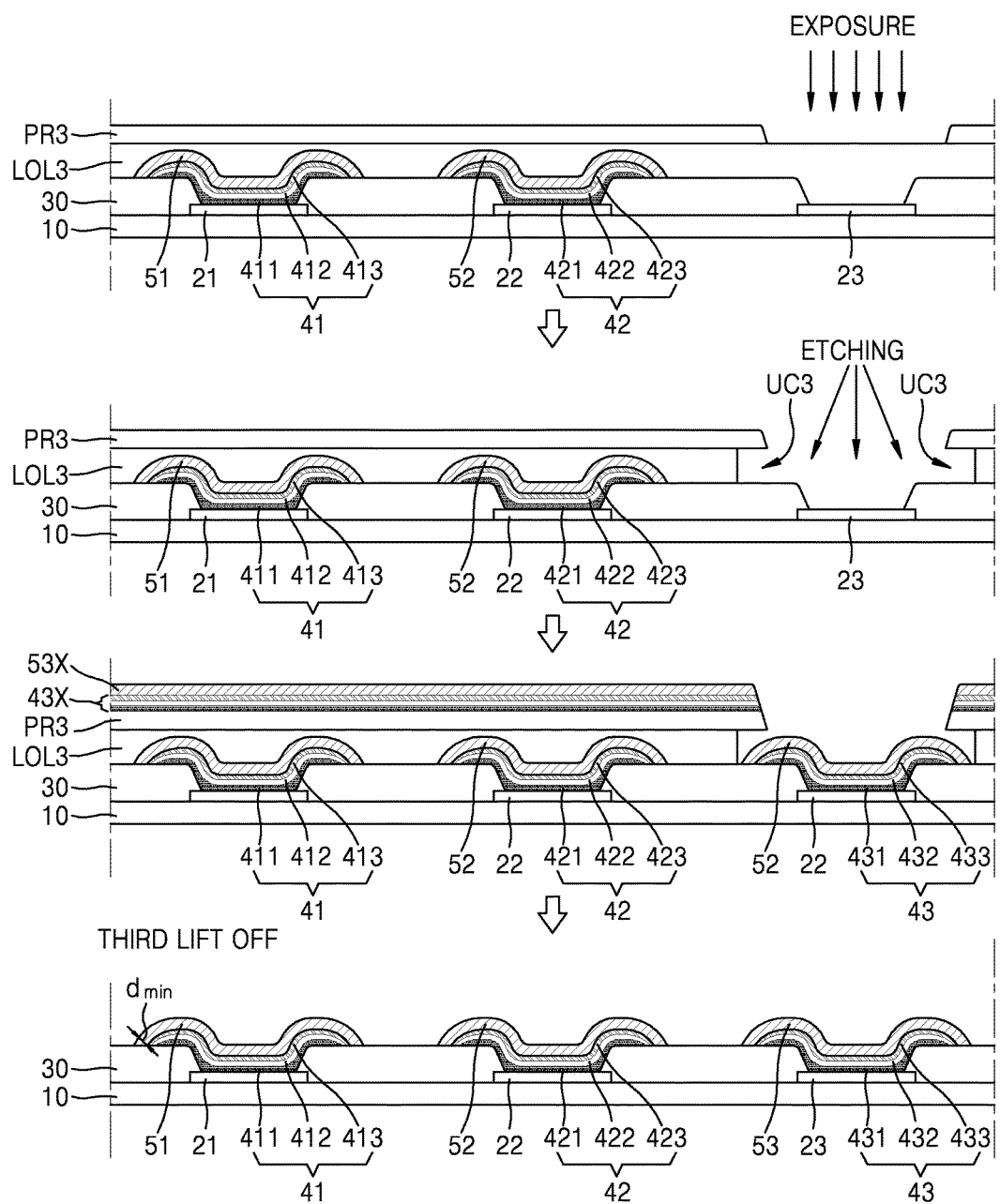

FIGS. 7A through 7C are cross-sectional views sequentially showing a method of manufacturing the organic light-emitting display apparatus of FIG. 6. FIGS. 7A through 7C illustrate procedures for depositing the first, second, and third intermediate layers 41, 42, and 43, and the first, second, and third protective layers 51, 52, and 53.

According to an exemplary embodiment, a process of forming the pixel electrode 20 on the substrate 10 includes forming the first pixel electrode 21, the second pixel electrode 22, and the third pixel electrode 23 that are spaced apart from each other on the substrate 10, and a process of depositing the intermediate layer 40 and the protective layer 50 includes depositing the first intermediate layer 41 emitting light with a first color, depositing the first protective layer 51 covering the first intermediate layer 41, depositing the second intermediate layer 42 emitting light with a second color, depositing the second protective layer 52 covering the second intermediate layer 42, depositing the third intermediate layer 43 emitting light with a third color, and depositing the third protective layer 53 covering the third intermediate layer 43, wherein the first, second, and third intermediate layers 41, 42, and 43 are spaced apart from each other, and the first, second, and third protective layers 51, 52, and 53 are spaced apart from each other.

FIG. 7A is a cross-sectional view illustrating a first process step of forming the first intermediate layer 41 and the first protective layer 51.

The pixel electrode 20 is formed on the substrate 10. The pixel electrode 20 may include the first, second, and third pixel electrodes 21, 22, and 23 that are spaced apart from each other. Although not illustrated in FIG. 7A, the first, second, and third pixel electrodes 21, 22, and 23 may be electrically connected to first, second, and third thin-film transistors (not shown), respectively, that are arranged between the substrate 10 and the first, second, and third pixel electrodes 21, 22, and 23. Then, the pixel-defining layer 30 that exposes at least a portion of each of the first, second, and third pixel electrodes 21, 22, and 23 is formed on the substrate 10 on which the first, second, and third pixel electrodes 21, 22, and 23 are formed.

After the pixel-defining layer 30 is formed, a first lift off layer LOL1 is formed over the substrate 10. The first lift off layer LOL1 has low chemical reactivity with the first intermediate layer 41 to be formed after a first lift off process to be described below. For example, the first lift off layer LOL1 may include the fluoropolymer.

The first lift off layer LOL1 may be formed by using a coating method, a printing method, a deposition method, or the like. When the first lift off layer LOL1 is formed by using the coating method and the printing method, a process of performing a curing treatment and/or a polymerizing treatment and then forming a first photoresist layer PR1 may be performed, if required.

A thickness of the first lift off layer LOL1 may be between about 0.2 μm and about 5 μm. If the thickness of the first lift off layer LOL1 is too large, a time taken in melting the first lift off layer LOL1 so as to perform a patterning operation is increased, and thus, a manufacturing time may be increased. If the thickness of the first lift off layer LOL1 is too small, it is difficult to perform a lift off process.

Afterward, the first photoresist layer PR1 is formed on the first lift off layer LOL1.

After a photoresist is coated entirely over the first lift off layer LOL1, a photoresist of a portion of the first lift off layer LOL1 overlapping the first pixel electrode 21 is exposed by using a first photo-mask (not shown) and is developed. In this regard, the photoresist may be a positive-type photoresist or a negative-type photoresist. Through this process, the portion of the photoresist overlapping the first pixel electrode 21 is removed.

Afterward, the first lift off layer LOL1 is etched by using the patterned first photoresist layer PR1 as an etching mask. When the first lift off layer LOL1 includes the fluoropolymer, a solvent capable of etching the fluoropolymer is used as an etching solution. For example, a 1-1 solvent (not shown) including fluorine may be used as the etching solution. The 1-1 solvent may include a hydrofluoroether. Through the etching process, the first lift off layer LOL1 formed on the first pixel electrode 21 is etched.

Through the etching process, a material of the first lift off layer LOL1, which is under the portion of the photoresist that has been developed and thus removed, is removed so that portions of the first pixel electrode 21 and the pixel-defining layer 30 are exposed. When the first lift off layer LOL1 is etched, the 1-1 solvent including fluorine forms a first undercut profile UC1 in the first lift off layer LOL1.

The first undercut profile UC1 may enable an exact deposition pattern with respect to the first intermediate layer 41, and may clearly remove the remaining first lift off layer LOL1 on the substrate 10 in a first lift off process to be described below. Since the first lift off layer LOL1 has been undercut, edges of the first photoresist layer PR1 project further toward the first pixel electrode 21 than edges of the first lift off layer LOL1.

Then, the first intermediate layer 41 is formed on the first pixel electrode 21. Afterward, the first protective layer 51 is formed on the first intermediate layer 41 so as to expose a portion of the pixel-defining layer 30.

The first intermediate layer 41 includes at least one common layer and a first emission layer. For example, the first intermediate layer 41 may include a 1-1 common layer 411, a first emission layer 412, and a 1-2 common layer 413. The 1-1 common layer 411 may be a HIL and/or HTL, and the 1-2 common layer 413 may be an ETL and/or EIL.

According to an exemplary embodiment, thicknesses of the 1-1 common layer 411, the 1-2 common layer 413, and the first emission layer 412 included in a side area (not shown) of the first intermediate layer 41 may decrease in a direction away from a center area (not shown) throughout the side area.

The first intermediate layer 41 and the first protective layer 51 may be formed through a deposition process. During the deposition process, the first lift off layer LOL1 and the first photoresist layer PR1 may function as a mask. In this regard, since a direction in which a deposition material from a deposition source is incident may not be perpendicular to the substrate 10, the first intermediate layer 41 and the first protective layer 51 may be formed so as to overlap edges of the first photoresist layer PR1, the edges projecting further toward the first pixel electrode 21 than edges of the first lift off layer LOL1. Through the deposition process with respect to the first intermediate layer 41 and the first protective layer 51, a material layer 41X forming the first intermediate layer 41 and a material layer 51X forming the first protective layer 51 are formed on the first photoresist layer PR1.

When the first intermediate layer 41 is formed on the first pixel electrode 21, an angle (a deposition incident angle of the first intermediate layer 41) between a direction in which a deposition material included in the first intermediate layer 41 is incident and a direction parallel to the substrate 10 changes as an intermediate layer deposition source (not shown) is moved or the substrate 10 is rotated. In this regard, a first angle θ1 is defined as a minimum value of deposition incident angle of the first intermediate layer 41. Here, the deposition incident angle of the first intermediate layer 41 means an angle equal to or less than 90 degrees, the angle from among angles between directions in which the deposition material is incident and the direction parallel to the substrate 10. That is, the deposition material included in the first intermediate layer 41 is incident onto the substrate 10 by at least the first angle θ1.

As described above, the edges of the first photoresist layer PR1 may project further toward the first pixel electrode 21 than the edges of the first photoresist layer PR1. The projecting first photoresist layer PR1 functions as a mask, and thus, a thickness of the first intermediate layer 41 decreases at a side area of the first intermediate layer 41.

The forming of the first intermediate layer 41 may include forming the 1-1 common layer 411, forming the first emission layer 412, and forming the 1-2 common layer 413. The 1-1 common layer 411, the first emission layer 412, and the 1-2 common layer 413 may be formed while a deposition angle is adjusted to have at least the first angle θ1, and thicknesses of the first common layer 401, the emission layer 402, and the second common layer 403 may decrease at their side areas. The side area of the first intermediate layer 41 may correspond to an undercut area of the first lift off layer LOL1.

Referring to FIG. 7A, the first protective layer 51 is formed on the first intermediate layer 41. As for the first intermediate layer 41, the first protective layer 51 may also be formed through a deposition process. The first protective layer 51 may completely cover the first intermediate layer 41, and the material layer 51X forming the first protective layer 51 may be formed above the first photoresist layer PR1.

Since the first protective layer 51 is formed by using the first lift off layer LOL1 and the first photoresist layer PR1 as a mask, the first protective layer 51 cannot be formed in an area of the first lift off layer LOL1. That is, the first protective layer 51 may be formed only on a portion of the pixel-defining layer 30. That is, the first protective layer 51 may be formed to expose another portion of the pixel-defining layer 30.

When the first protective layer 51 is formed on the first intermediate layer 41, an angle (a deposition incident angle of the first protective layer 51) between a direction in which a deposition material included in the first protective layer 51 is incident and a direction parallel to the substrate 10 changes as a protective layer deposition source (not shown) is moved or the substrate 10 is rotated. In this regard, a second angle θ2 is defined as a minimum value of the deposition incident angle of the first protective layer 51. The deposition incident angle of the first protective layer 51 means an angle equal to or less than 90 degrees, the angle from among angles between directions in which the deposition material is incident and the direction parallel to the substrate 10. That is, the deposition material included in the first protective layer 51 is incident onto the substrate 10 by at least the second angle θ2.

In this regard, the second angle θ2 may be smaller than the first angle θ1, and for example, the first angle θ1 may be greater than the second angle θ2 by about 5 degrees. When the second angle θ2 is smaller than the first angle θ1 as described above, the first protective layer 51 may be more deeply deposited toward the first lift off layer LOL1 as compared with the first intermediate layer 41. Therefore, the thickness of the side area 40E of the first intermediate layer 41 decreases in a direction away from the center area 40C throughout the side area 40E, but the thickness of the first protective layer 51 does not decrease in a direction away from the center area 40C, and even if the thickness of the first protective layer 51 does decrease, a rate of the decrease of the thickness of the first protective layer 51 may be lower than a rate of the decrease of the thickness of first intermediate layer 41.

According to an exemplary embodiment, the first protective layer 51 may be formed in such a manner that a minimum value $d_{min}$ of a distance between the first intermediate layer 41 and the opposite electrode 60 that are spaced part from each other may be between about 50 Å and about 1000 Å.

Afterward, the first lift off process is performed. When the first lift off layer LOL1 includes a fluoropolymer, a 2-1 solvent including fluorine may be used in a lift off process. Since the lift off process is performed after the first intermediate layer 41 and the first protective layer 51 are formed, it is preferable that the 2-1 solvent has low reactivity with the first intermediate layer 41. The 2-1 solvent may include a hydrofluoroether as the 1-1 solvent does.

When the first lift off layer LOL1 is removed, the first photoresist layer PR1, the material layer 41X forming the first intermediate layer 41, and the material layer 51X forming the first protective layer 51 that are formed on the first lift off layer LOL1 are also removed. Through the aforementioned photo-patterning process, i.e., the first process step, the first intermediate layer 41 and the first protective layer 51 are formed on portions of the first pixel electrode 21 and the pixel-defining layer 30.

After the first process step is performed, a second process step of forming the second intermediate layer 42 on the second pixel electrode 22 is performed, the second intermediate layer 42 emitting light with a color different from the first intermediate layer 41. Hereinafter, with reference to FIG. 7B, the second process step is described.

Referring to FIG. 7B, a second lift off layer LOL2 is formed over the substrate 10 on which the first, second, and third pixel electrodes 21, 22, and 23 are formed. The second lift off layer LOL2 has low chemical reactivity with the second intermediate layer 42 to be formed at a later time. For example, the second lift off layer LOL2 may include a fluoropolymer. Unlike the first process step, the second lift off layer LOL2 may include not only a fluoropolymer but may also include an absorbent. The absorbent captures oxygen and moisture that pass through the second lift off layer LOL2 to thereby prevent deterioration of the first intermediate layer 41 formed in the first process step.

The absorbent may include a compound such as calcium oxide, barium oxide, aluminum oxide, magnesium oxide, etc., in which a metal is combined with oxygen and which may form a metal hydroxide by reacting with water. In addition, the absorbent may include at least one material from among a metal halogen compound, a metallic inorganic acid salt, an organic acid salt, a porous inorganic compound, or a combination thereof. The absorbent may include an acryl-based organic material, a methacryl-based organic material, a polyisoprene-based organic material, a vinyl-based organic material, an epoxy-based organic material, a urethane-based organic material, a cellulose-based organic material, or the like. The absorbent may include a titanium-based inorganic material, a silicon oxide-based inorganic material, a zirconium-based inorganic material, an alumina-based inorganic material, or the like. The absorbent may include a sealant made of epoxy silane, vinylsilane, aminosilane, or methacrylate silane.

The second lift off layer LOL2 may be formed by using a coating method, a printing method, a deposition method, or the like. When the second lift off layer LOL2 is formed by using the coating method and the printing method, a process of performing a curing treatment and/or a polymerizing treatment and then forming a second photoresist layer PR2 may be performed, if required.

A thickness of the second lift off layer LOL2 may be between about 0.2 μm and about 5 μm. If the thickness of the second lift off layer LOL2 is too large, a time taken to melt the second lift off layer LOL2 when performing a patterning operation increases, and thus, a manufacturing time may increase. If the thickness of the second lift off layer LOL2 is too small, it is difficult to perform a lift off process.

Afterward, the second photoresist layer PR2 is formed on the second lift off layer LOL2. After a photoresist is coated entirely over the second lift off layer LOL2, a portion of the photoresist overlapping the second pixel electrode 22 is exposed by using a second photo-mask (not shown) and is developed. In this regard, the photoresist may be a positive-type photoresist or a negative-type photoresist. Through this process, the portion of the photoresist overlapping the second pixel electrode 22 is removed.

Afterward, the second lift off layer LOL2 is etched by using the patterned second photoresist layer PR2 as an etching mask. When the second lift off layer LOL2 includes the fluoropolymer, a solvent capable of etching the fluoropolymer is used as an etching solution. The etching solution may include a 1-2 solvent (not shown) including fluorine. The 1-2 solvent may include a hydrofluoroether, as in the first process step. However, the 1-2 solvent may include a material different from that of the first unit process.

Through the etching process, the second lift off layer LOL2 formed on the second pixel electrode 22 is etched. Thus, a material of the second lift off layer LOL2 under the area from which the portion of the photoresist was removed by developing is removed, so that portions of the second pixel electrode 22 and the pixel-defining layer 30 are exposed. When the second lift off layer LOL2 is etched, the 1-2 solvent including fluorine forms a second undercut profile UC2 in the second lift off layer LOL2.

The second undercut profile UC2 may enable an exact deposition pattern with respect to the second intermediate layer 42 in a deposition process to be described below, and may allow the remaining second lift off layer LOL2 on the substrate 10 to be clearly removed in a second lift off process to be described below. Since the second lift off layer LOL2 has been undercut, edges of the second photoresist layer PR2 project further toward the second pixel electrode 22 than edges of the second lift off layer LOL2.

Then, the second intermediate layer 42 is formed on the second pixel electrode 22. Afterward, the second protective layer 52 is formed on the second intermediate layer 42 so as to expose a portion of the pixel-defining layer 30.

The second intermediate layer 42 includes at least one common layer and a second emission layer. For example, the second intermediate layer 42 may include a 2-1 common layer 421, a second emission layer 422, and a 2-2 common layer 423. The 2-1 common layer 421 may be an HIL and/or HTL, and the 2-2 common layer 423 may be an ETL and/or EIL.

According to an exemplary embodiment, thicknesses of the 2-1 common layer 421, the 2-2 common layer 423, and the second emission layer 422 included in a side area (not shown) of the second intermediate layer 42 may each decrease in a direction away from a center area (not shown).

The second intermediate layer 42 and the second protective layer 52 may be formed through a deposition process. During the deposition process, the second lift off layer LOL2 and the second photoresist layer PR2 may function as a mask. In this regard, since a direction in which a deposition material from a deposition source is incident may not be perpendicular to the substrate 10, the second intermediate layer 42 and the second protective layer 52 may be formed so as to overlap edges of the second photoresist layer PR2, the edges projecting further toward the second pixel electrode 22 than edges of the second lift off layer LOL2. Through the deposition process with respect to the second intermediate layer 42 and the second protective layer 52, a material layer 42X forming the second intermediate layer 42 and a material layer 52X forming the second protective layer 52 are formed on the second photoresist layer PR2.

The second intermediate layer 42 and the second protective layer 52 are deposited in a manner similar to the process of depositing the first intermediate layer 41 and the first protective layer 51 during the first process step. That is, the second protective layer 52 is incident on the substrate 10 by a deposition angle smaller than a deposition angle of the second intermediate layer 42. Therefore, a thickness of the second intermediate layer 42 decreases in a direction away from a center area (not shown) throughout a side area (not shown), whereas a thickness of the second protective layer 52 does not decrease in a direction away from the center area, or even if the thickness of the second protective layer 52 does decrease, a rate of the decrease of the thickness of the second protective layer 52 may be lower than a rate of the decrease of the thickness of the second intermediate layer 42.

According to an exemplary embodiment, the second protective layer 52 may be formed in such a manner that a minimum value $d_{min}$ of a distance between the second intermediate layer 42 and the opposite electrode 60 that are spaced part from each other may be between about 50 Å and about 1000 Å.

Afterward, the second lift off process is performed. When the second lift off layer LOL2 includes a fluoropolymer, a 2-2 solvent including fluorine may be used in a lift off process. Since the lift off process is performed after the second intermediate layer 42 and the second protective layer 52 are formed, it is preferable that the 2-2 solvent has low reactivity with the second intermediate layer 42. The 2-2 solvent may include a hydrofluoroether as the 1-2 solvent does.

When the second lift off layer LOL2 is removed, the second photoresist layer PR2, the material layer 42X forming the second intermediate layer 42, and the material layer 52X forming the second protective layer 52 that are formed on the second photoresist layer PR2 are also removed. Through the aforementioned photo-patterning process, i.e., the second process step, the second intermediate layer 42 and the second protective layer 52 are formed on portions of the second pixel electrode 22 and the pixel-defining layer 30.

After the second process step is performed, a third process step of forming the third intermediate layer 43 and the third protective layer 53 on the third pixel electrode 23 is performed. Hereinafter, with reference to FIG. 7C, the third process step is described.

Referring to FIG. 7C, a third lift off layer LOL3 is formed over the substrate 10 on which the first, second, and third pixel electrodes 21, 22, and 23 are formed. The third lift off layer LOL3 has low chemical reactivity with the third intermediate layer 43 to be formed after a third lift off process to be described below. For example, the third lift off layer LOL3 may include a fluoropolymer. Similar to the second process step, the third lift off layer LOL3 may include not only a fluoropolymer but may also include an absorbent. The absorbent captures oxygen and moisture that pass through the third lift off layer LOL3, thereby preventing deterioration of the first intermediate layer 41 formed in the first process step and the second intermediate layer 42 formed in the second process step. Types of the absorbent are described above.

The third lift off layer LOL3 may be formed by using a coating method, a printing method, a deposition method, or the like. When the third lift off layer LOL3 is formed by using the coating method and the printing method, a process of performing a curing treatment and/or a polymerizing treatment and then forming a third photoresist layer PR3 may be performed, if required.

A thickness of the third lift off layer LOL3 may be between about 0.2 μm and about 5 μm. If the thickness of the third lift off layer LOL3 is too large, a time taken in melting the third lift off layer LOL3 so as to perform a patterning operation is increased, and thus, a manufacturing time may be increased. If the thickness of the third lift off layer LOL3 is too small, it is difficult to perform a lift off process.

Afterward, the third photoresist layer PR3 is formed on the third lift off layer LOL3. After a photoresist is coated entirely over the third lift off layer LOL3, a portion of the photoresist overlapping the third pixel electrode 23 is exposed by using a third photo-mask (not shown) and is developed. In this regard, the photoresist may be a positive-type photoresist or a negative-type photoresist. Through this process, the portion of the photoresist overlapping the third pixel electrode 23 is removed.

Afterward, the third lift off layer LOL3 is etched by using the patterned third photoresist layer PR3 as an etching mask. When the third lift off layer LOL3 includes the fluoropolymer, a solvent capable of etching the fluoropolymer is used as an etching solution. The etching solution may include a 1-3 solvent (not shown) including fluorine. The 1-3 solvent may include a hydrofluoroether, as in the first process step. However, the 1-3 solvent may include a material different from that of the first process step.

Through the etching process, the third lift off layer LOL3 formed on the third pixel electrode 23 is etched. Thus, a material of the third lift off layer LOL3 under the area from which the portion of the photoresist was removed by developing is removed, so that portions of the third pixel electrode 23 and the pixel-defining layer 30 are exposed. When the third lift off layer LOL3 is etched, the 1-3 solvent including fluorine forms a third undercut profile UC3 in the third lift off layer LOL3.

The third undercut profile UC3 may enable an exact deposition pattern with respect to the third intermediate layer 43 in a deposition process to be described below, and may allow the remaining third lift off layer LOL3 on the substrate 10 to be clearly removed in a third lift off process to be described below. Since the third lift off layer LOL3 has been undercut, edges of the third photoresist layer PR3 project further toward the third pixel electrode 23 than edges of the third lift off layer LOL3.

The third intermediate layer 43 includes at least one common layer and a third emission layer. For example, the third intermediate layer 43 may include a 3-1 common layer 431, a third emission layer 432, and a 3-2 common layer 433. The 3-1 common layer 431 may be an HIL and/or HTL, and the 3-2 common layer 433 may be an ETL and/or EIL.

According to an exemplary embodiment, thicknesses of the 3-1 common layer 431, the 3-2 common layer 433, and the third emission layer 432 included in a side area (not shown) of the third intermediate layer 43 may each decrease in a direction away from a center area (not shown) throughout the side area.

Then, the third intermediate layer 43 is formed on the third pixel electrode 23. Afterward, the third protective layer 53 is formed on the third intermediate layer 43 so as to expose a portion of the pixel-defining layer 30.

The third intermediate layer 43 and the third protective layer 53 may be formed through a deposition process. During the deposition process, the third lift off layer LOL3 and the third photoresist layer PR3 may function as a mask. In this regard, since a direction in which a deposition material from a deposition source is incident may not be perpendicular to the substrate 10, the third intermediate layer 43 and the third protective layer 53 may be formed so as to overlap edges of the third photoresist layer PR3, the edges projecting further toward the third pixel electrode 23 than edges of the third lift off layer LOL3. Through the deposition process with respect to the third intermediate layer 43 and the third protective layer 53, a material layer 43X forming the third intermediate layer 43 and a material layer 53X forming the third protective layer 53 are formed on the third photoresist layer PR3.

The third intermediate layer 43 and the third protective layer 53 are deposited in a manner similar to the process of depositing the first intermediate layer 41 and the first protective layer 51 during the first process step. That is, the third protective layer 53 is incident on the substrate 10 by a deposition angle smaller than a deposition angle of the third intermediate layer 43. Therefore, a thickness of the third intermediate layer 43 decreases in a direction away from a center area (not shown), whereas a thickness of the third protective layer 53 does not decrease in a direction away from the center area, or even if the thickness of the third protective layer 53 decreases, a rate of the decrease of the thickness of the third protective layer 53 may be lower than a rate of the decrease of the thickness of the third intermediate layer 43.

According to an exemplary embodiment, the third protective layer 53 may be formed in such a manner that a minimum value $d_{min}$ of a distance between the third intermediate layer 43 and the opposite electrode 60 that are spaced part from each other may be between about 50 Å and about 1000 Å.

Afterward, the third lift off process is performed. When the third lift off layer LOL3 includes a fluoropolymer, a 2-3 solvent including fluorine may be used in a lift off process. Since the lift off process is performed after the third intermediate layer 43 is formed, it is preferable that the 2-3 solvent has low reactivity with the third intermediate layer 43. The 2-3 solvent may include a hydrofluoroether as the 1-3 solvent does.

When the third lift off layer LOL3 is removed, the third photoresist layer PR3, the material layer 43X forming the third intermediate layer 43, and the material layer 53X forming the third protective layer 53 that are formed on the third photoresist layer PR3 are also removed. Through the aforementioned photo-patterning process, i.e., the third process step, the third intermediate layer 43 and the third protective layer 53 are formed on portions of the third pixel electrode 23 and the pixel-defining layer 30.

The first intermediate layer 41 emits light with a first color, the second intermediate layer 42 emits light with a second color, and the third intermediate layer 43 emits light with a third color. For example, the first color may be red, the second color may be green, and the third color may be blue, but the present disclosure is not limited thereto and any three colors that make a white color when combined may do. The first intermediate layer 41, the second intermediate layer 42, or the third intermediate layer 43 may emit white light.

Referring back to FIG. 6, after the first, second, and third protective layers 51, 52, and 53 are deposited, the opposite electrode 60 is formed thereon. Unlike the first, second, and third protective layers 51, 52, and 53, the opposite electrode 60 may be formed as one body.

According to the manufacturing methods of FIGS. 7A through 7C, the first, second, and third protective layers 51, 52, and 53 are sequentially deposited on the first, second, and third intermediate layers 41, 42, and 43 during the respective process steps, thereby preventing the first, second, and third intermediate layers 41, 42, and 43 from being damaged in the respective subsequent lift off processes. Also, after the first, second, and third process steps, the first, second, and third protective layers 51, 52, and 53 electrically contact the opposite electrode 60 that may be commonly formed in a plurality of pixels, thereby preventing a voltage drop of the opposite electrode 60.

The present disclosure may provide the organic light-emitting display apparatus and the method of manufacturing the organic light-emitting display apparatus in which the occurrence of a defective pixel is decreased because damage to the intermediate layer 40 including the emission layer 402 is prevented.

Although not illustrated in drawings, the aforementioned organic light-emitting display apparatuses may each further include an encapsulation member that encapsulates the emission layer. The encapsulation member may include a glass substrate, a metal foil, a thin-film encapsulation layer including both an inorganic layer and an organic layer, or the like.

The one or more exemplary embodiments may provide the organic light-emitting display apparatus and the method of manufacturing the organic light-emitting display apparatus in which the occurrence of a defective pixel is decreased by preventing damage to an intermediate layer including an emission layer. However, the scope of the present disclosure is not limited by the aforementioned features.

Although certain exemplary embodiments and implementations have been described herein, other embodiments and modifications will be apparent from this description. Accordingly, the inventive concepts are not limited to such exemplary embodiments, but rather to the broader scope of the presented claims and various obvious modifications and equivalent arrangements.

What is claimed is:

1. An organic light-emitting display apparatus, comprising:
    a substrate;
    a pixel electrode on the substrate, wherein the pixel electrode further comprises a center portion and a periphery portion that surrounds the center portion;
    a pixel-defining layer, wherein the pixel-defining layer covers the periphery portion and exposes at least the center portion;
    an intermediate layer, wherein the intermediate layer further comprises a center area on the pixel electrode and a side area extending from the center area and arranged on the pixel-defining layer, the intermediate layer further comprises a common layer and an emission layer;
    a protective layer, wherein the protective layer completely covers both the center area and the side area to form an island shape and is arranged apart from an adjacent protective layer to expose a portion of the pixel-defining layer; and
    an opposite electrode, wherein the opposite electrode is spaced apart from the intermediate layer by the protective layer and arranged on the protective layer and a portion of the pixel-defining layer, and the portion is exposed by the protective layer.

2. The organic light-emitting display apparatus of claim 1, wherein a minimum value of a distance between the intermediate layer and the opposite electrode that are spaced apart from each other is between about 50 Å and about 1000 Å.

3. The organic light-emitting display apparatus of claim 1, wherein the protective layer further comprises an area, wherein the area directly contacts the pixel-defining layer.

4. The organic light-emitting display apparatus of claim 1, wherein a thickness of the common layer and the emission layer within the side area of the intermediate layer decrease in a direction away from the center area throughout the side area.

5. The organic light-emitting display apparatus of claim 4, wherein a difference between a thickness of the emission layer at the center area and a minimum thickness of the emission layer is greater than a difference between a thickness of a portion of the protective layer, wherein the portion covers the center area of the intermediate layer, and a minimum thickness of another portion of the protective layer, wherein the other portion covers the side area of the intermediate layer.

6. The organic light-emitting display apparatus of claim 1, wherein the pixel electrode is a reflective electrode, and the opposite electrode is a transflective electrode or a transmissive electrode.

7. The organic light-emitting display apparatus of claim 6, wherein the protective layer and the opposite electrode comprise a conductive material.

8. The organic light-emitting display apparatus of claim 7, wherein the conductive material further comprises Al, Mg, Li, Ca, Cu, LiF/Ca, LiF/Al, MgAg, CaAg, or a compound thereof.

9. The organic light-emitting display apparatus of claim 1, wherein the pixel electrode is a transflective electrode or a transmissive electrode, and the opposite electrode is a reflective electrode.

10. The organic light-emitting display apparatus of claim 9, wherein the protective layer and the opposite electrode further comprise a conductive material.

11. The organic light-emitting display apparatus of claim 10, wherein the conductive material further comprises Ag, Al, Mg, Li, Ca, Cu, LiF/Ca, LiF/Al, MgAg, CaAg, or a compound thereof.

12. The organic light-emitting display apparatus of claim 1, wherein
    the pixel electrode further comprises a first pixel electrode, a second pixel electrode, and a third pixel electrode, wherein the first pixel electrode, the second pixel electrode, and the third pixel electrode are spaced apart from each other on the substrate, and
    wherein the intermediate layer further comprises:
        a first intermediate layer arranged on the first pixel electrode and emits light with a first color;
        a second intermediate layer arranged on the second pixel electrode and emits light with a second color; and
        a third intermediate layer arranged on the third pixel electrode and emits light with a third color,
        wherein the first intermediate layer, the second intermediate layer, and the third intermediate layer are spaced apart from each other.

13. The organic light-emitting display apparatus of claim 12, wherein the protective layer further comprises:
    a first protective layer wherein the first protective layer covers the first intermediate layer;
    a second protective layer wherein the second protective layer covers the second intermediate layer; and
    a third protective layer wherein the third protective layer covers the third intermediate layer,
    wherein the first protective layer, the second protective layer, and the third protective layer are spaced apart from each other.

14. A method of manufacturing an organic light-emitting display apparatus, the method comprising:

forming a pixel electrode on a substrate, wherein the pixel electrode further comprises a center portion and a periphery portion that surrounds the center portion;

forming a pixel-defining layer, wherein the pixel-defining layer covers the periphery portion and exposes at least the center portion;

forming, on the pixel electrode and the pixel-defining layer, an intermediate layer comprising a center area on the pixel electrode and a side area extending from the center area and arranged on the pixel-defining layer, wherein the intermediate layer further comprises a common layer and an emission layer;

forming, on the intermediate layer, a protective layer wherein the protective layer completely covers a top surfaces of both the center area and the side area to form an island shape and is arranged apart from an adjacent protective layer to expose a portion of the pixel-defining layer; and forming, on the protective layer and the portion of the pixel-defining layer, an opposite electrode wherein the opposite electrode is spaced apart from the intermediate layer by the protective layer and arranged on the protective layer and a portion of the pixel-defining layer, and the portion is exposed by the protective layer.

15. The method of claim 14, wherein, in the forming of the protective layer, the protective layer is formed so that a minimum value of a distance between the intermediate layer and the opposite electrode is between about 50 Å and about 1000 Å.

16. The method of claim 14, wherein the forming of the intermediate layer and the forming of the protective layer further comprises:
forming a lift off layer on the pixel-defining layer;
forming a photoresist layer on the lift off layer;
patterning the photoresist layer;
exposing portions of the pixel electrode and the pixel-defining layer by etching the lift off layer by using the photoresist layer as an etching mask;
forming the intermediate layer by depositing a material of the intermediate layer on the exposed portions of the pixel electrode and the pixel-defining layer that are exposed by the lift off layer;
forming, on the intermediate layer, the protective layer by depositing a material of the protective layer by using the lift off layer and the photoresist layer as a mask; and
removing the lift off layer and the photoresist layer.

17. The method of claim 16, wherein
the forming of the intermediate layer further comprises allowing the material of the intermediate layer to be incident on the exposed portions of the pixel electrode and the pixel-defining layer by at least a first degree; and the depositing of the material of the protective layer further comprises allowing the material of the protective layer to be incident on the intermediate layer by at least a second degree, wherein the second degree is less than the first degree, wherein the first degree is a minimum value of an angle between a direction parallel to the substrate and a direction in which the material of the intermediate layer is incident, and the second degree is a minimum value of an angle between the direction parallel to the substrate and a direction in which the material of the protective layer is incident.

18. The method of claim 17, wherein the first degree is greater than the second degree by about 5 degrees.

19. The method of claim 14, wherein
the forming of the pixel electrode further comprises forming a first pixel electrode, a second pixel electrode, and a third pixel electrode, wherein the first pixel electrode, the second pixel electrode, and the third pixel electrode are spaced apart from each other on the substrate; and the forming of the intermediate layer and the forming of the protective layer further comprise:
depositing a first intermediate layer on the first pixel electrode, wherein the first intermediate layer emits light with a first color;
depositing a first protective layer on the first intermediate layer;
depositing a second intermediate layer on the second pixel electrode, the wherein second intermediate layer emits light with a second color;
depositing a second protective layer on the second intermediate layer;
depositing a third intermediate layer on the third pixel electrode, wherein the third intermediate layer emits light with a third color; and
depositing a third protective layer on the third intermediate layer,
wherein the first intermediate layer, the second intermediate layer, and the third intermediate layer are spaced apart from each other, and
the first protective layer, the second protective layer, and the third protective layer are spaced apart from each other.

* * * * *